(12) United States Patent
Lee et al.

(10) Patent No.: US 12,507,523 B2
(45) Date of Patent: Dec. 23, 2025

(54) DISPLAY PANEL

(71) Applicant: Samsung Display Co., Ltd., Yongin-si (KR)

(72) Inventors: Hongbeom Lee, Yongin-si (KR);
Jeongho Lee, Yongin-si (KR);
Swaehyun Kim, Yongin-si (KR);
Youhan Moon, Yongin-si (KR); Yeonju Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 411 days.

(21) Appl. No.: 18/315,971

(22) Filed: May 11, 2023

(65) Prior Publication Data

US 2024/0081094 A1    Mar. 7, 2024

(30) Foreign Application Priority Data

Sep. 1, 2022  (KR) ........................ 10-2022-0110961

(51) Int. Cl.
*H10K 50/844*    (2023.01)
*H10D 86/40*    (2025.01)
(Continued)

(52) U.S. Cl.
CPC ......... *H10K 50/844* (2023.02); *H10D 86/411* (2025.01); *H10D 86/60* (2025.01);
(Continued)

(58) Field of Classification Search
CPC ...... H10K 59/38; H10K 50/844; H10K 59/12; H10K 71/00; H10K 59/1201; H10K 2102/331; H10K 59/1213; H10K 59/123; H10K 59/122; H10K 50/115; H10K 50/125; H10K 50/8426; H10K 50/856; H10K 71/40; H01L 27/322; H01L 27/3244;
(Continued)

(56) References Cited

U.S. PATENT DOCUMENTS 9,971,198 B2 *  5/2018  Cho .................. G02F 1/133617
10,205,122 B2   2/2019  Choi et al.
(Continued)

FOREIGN PATENT DOCUMENTS

CN          114039015 A      2/2022
KR     10-2017-0059864 A     5/2017

*Primary Examiner* — Caleb E Henry
(74) *Attorney, Agent, or Firm* — Womble Bond Dickinson (US) LLP

(57) ABSTRACT

A display panel includes: a substrate including: a first area; a second area; and a third area between the first and second areas; a light emitting diode at the second area; an encapsulation layer over the light emitting diode; first and second partition walls at the third area; a first separator between the second partition wall and the first area; a second separator between the first separator and the first area; and a first groove between the first separator and the second separator. Each of the first and second separators includes: a first metal pattern layer; a first inorganic pattern layer; a second metal pattern layer; a second inorganic pattern layer; a third metal pattern layer; and a third inorganic pattern layer. An end portion of each of the first, second, and third inorganic pattern layers includes a tip extending toward a center of the first groove.

20 Claims, 19 Drawing Sheets

(51) Int. Cl.
*H10D 86/60* (2025.01)
*H10K 59/121* (2023.01)
*H10K 59/124* (2023.01)
*H10K 59/40* (2023.01)
*H10K 59/88* (2023.01)
*H10K 102/00* (2023.01)

(52) U.S. Cl.
CPC ....... *H10K 59/1213* (2023.02); *H10K 59/124* (2023.02); *H10K 59/88* (2023.02); *H10K 59/40* (2023.02); *H10K 2102/351* (2023.02)

(58) Field of Classification Search
CPC ................. H01L 51/5253; H01L 51/56; H01L 2227/323; H01L 2251/5369; H01L 27/3246; H01L 27/3248; H01L 27/3262; H01L 51/0026; H01L 51/502; H01L 51/5036; H01L 51/5246; H01L 51/5271; G02B 5/201; G02B 5/206
See application file for complete search history.

(56) References Cited

U.S. PATENT DOCUMENTS

| | | | | |
|---|---|---|---|---|
| 2008/0303419 | A1* | 12/2008 | Fukuda | H10K 59/122 |
| | | | | 313/506 |
| 2010/0219427 | A1* | 9/2010 | Fukuda | H10K 50/854 |
| | | | | 257/89 |
| 2011/0006313 | A1* | 1/2011 | Sumioka | H10K 50/856 |
| | | | | 257/E33.072 |
| 2011/0101386 | A1* | 5/2011 | Fukuda | H10K 50/856 |
| | | | | 257/89 |
| 2011/0233572 | A1* | 9/2011 | Nakatani | H10K 59/122 |
| | | | | 257/88 |
| 2014/0160408 | A1* | 6/2014 | Cho | G02F 1/133617 |
| | | | | 349/110 |
| 2016/0204167 | A1* | 7/2016 | Jun | H10K 59/80522 |
| | | | | 257/72 |
| 2016/0372528 | A1* | 12/2016 | Kamura | H10K 30/87 |
| 2017/0003423 | A1* | 1/2017 | Jiang | G02F 1/133514 |
| 2017/0255054 | A1* | 9/2017 | Li | G02F 1/133617 |
| 2017/0315409 | A1* | 11/2017 | Cho | G02F 1/133617 |
| 2018/0031909 | A1* | 2/2018 | Liu | G02F 1/1368 |
| 2018/0031910 | A1* | 2/2018 | Li | G02F 1/13394 |
| 2018/0102449 | A1* | 4/2018 | Pschenitzka | G02F 1/133528 |
| 2018/0210280 | A1* | 7/2018 | Chen | G02F 1/1343 |
| 2018/0269260 | A1* | 9/2018 | Ghosh | H10K 59/38 |
| 2020/0013766 | A1* | 1/2020 | Kim | H01L 25/167 |
| 2020/0027928 | A1* | 1/2020 | Wu | H10K 50/131 |
| 2020/0091251 | A1* | 3/2020 | Hu | H10K 71/135 |
| 2020/0103709 | A1* | 4/2020 | Madigan | H10K 59/38 |
| 2020/0106045 | A1 | 4/2020 | Han et al. | |
| 2020/0110494 | A1* | 4/2020 | Chen | G06F 3/0412 |
| 2020/0152704 | A1* | 5/2020 | Jang | H10K 59/126 |
| 2020/0161585 | A1* | 5/2020 | Palles-Dimmock | |
| | | | | G09G 3/2003 |
| 2020/0212119 | A1* | 7/2020 | Shim | H10K 59/35 |
| 2020/0218084 | A1* | 7/2020 | Zhu | G02B 26/005 |
| 2020/0227484 | A1* | 7/2020 | Lin | G02B 6/0003 |
| 2020/0343315 | A1* | 10/2020 | Lin | H10K 59/8792 |
| 2021/0026193 | A1* | 1/2021 | Yu | G02F 1/133516 |
| 2021/0036197 | A1 | 2/2021 | Noh et al. | |
| 2021/0074770 | A1* | 3/2021 | Choe | G02B 5/206 |
| 2021/0151707 | A1 | 5/2021 | Huang et al. | |
| 2021/0159268 | A1* | 5/2021 | Heo | H10K 59/122 |
| 2021/0167146 | A1* | 6/2021 | Yang | H10K 59/123 |
| 2021/0193742 | A1* | 6/2021 | Kim | H10K 59/38 |
| 2021/0201791 | A1* | 7/2021 | Fukasawa | G09G 3/3258 |
| 2021/0202630 | A1* | 7/2021 | Jeon | H10K 50/844 |
| 2021/0202686 | A1* | 7/2021 | Jeon | H10K 50/19 |
| 2021/0210718 | A1 | 7/2021 | Zhang et al. | |
| 2022/0069255 | A1* | 3/2022 | You | H10K 59/80517 |
| 2022/0199946 | A1* | 6/2022 | Lee | H10D 86/60 |
| 2022/0208031 | A1* | 6/2022 | Choi | H10K 77/111 |
| 2022/0209187 | A1 | 6/2022 | Bok et al. | |
| 2022/0310972 | A1* | 9/2022 | Park | H10K 59/40 |

* cited by examiner

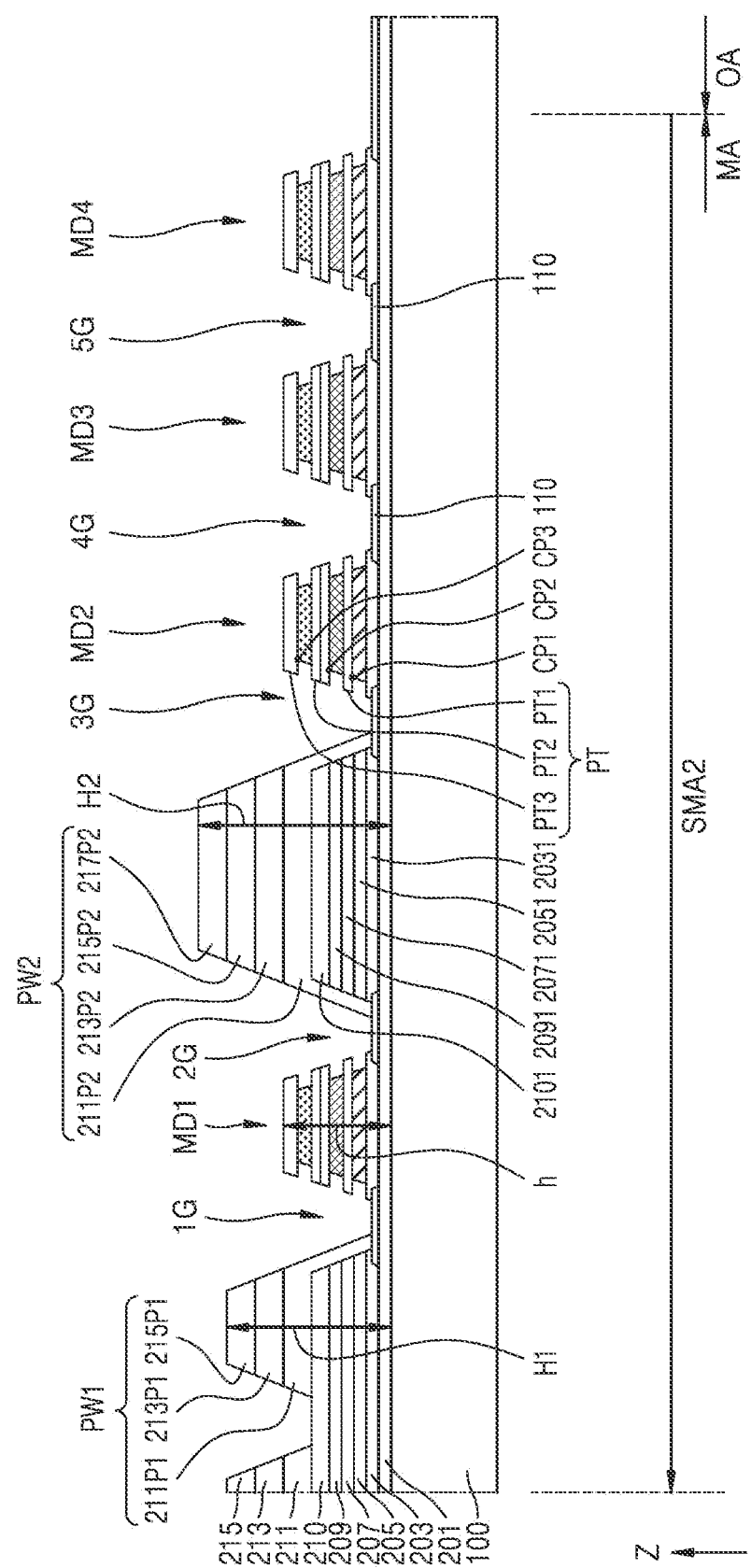

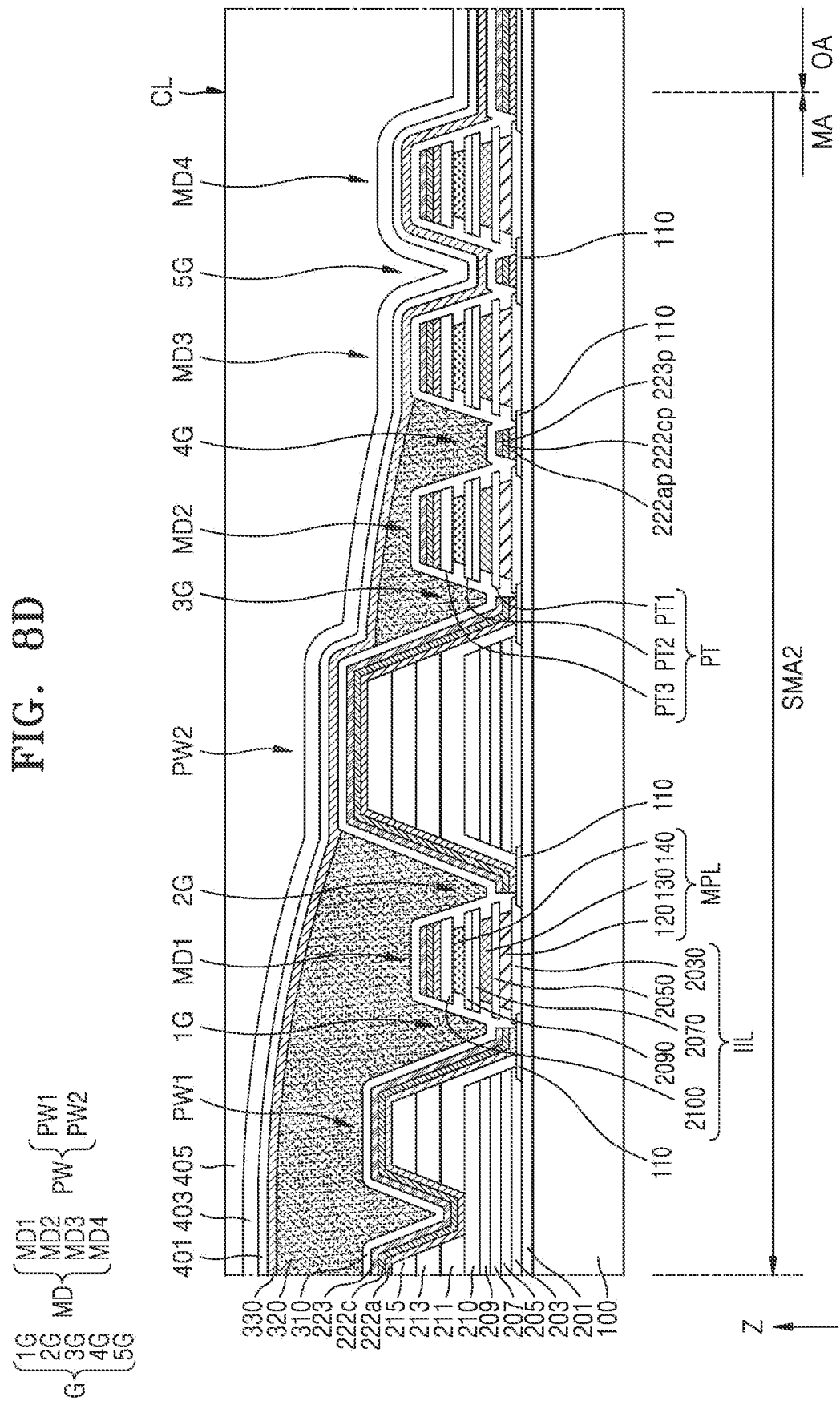

DISPLAY PANEL

CROSS-REFERENCE TO RELATED APPLICATION his application claims priority to and the benefit of Korean Patent Application No. 10-2022-0110961, filed on Sep. 1, 2022, in the Korean Intellectual Property Office, the entire disclosure of which is incorporated by reference herein.

BACKGROUND

1. Field

Aspects of one or more embodiments of the present disclosure relate to display panels.

2. Description of the Related Art

Recently, display panels have been used for various purposes. Also, as display panels have become thinner and lighter, their range of use has widened.

As an area occupied by a display area in a display panel has been expanded, various functions that are combined or associated with a display panel have been added. As a scheme for adding various functions to the display panel while expanding the area of the display area, research has been conducted into a display apparatus in which various components may be arranged in the display area thereof.

The above information disclosed in this Background section is for enhancement of understanding of the background of the present disclosure, and therefore, it may contain information that does not constitute prior art.

SUMMARY

One or more embodiments of the present disclosure are directed to a display panel including an opening area, in which various kinds of components may be arranged, in a display area thereof.

However, the aspects and features of the present disclosure are not limited to those described above, and additional aspects and features will be set forth, in part, in the description that follows, and in part, will be apparent from the description, or may be learned by practicing one or more of the presented embodiments of the present disclosure.

According to one or more embodiments of the present disclosure, a display panel includes: a substrate including: a first area; a second area surrounding at least a portion of the first area; and a third area between the first area and the second area; a light emitting diode at the second area, and including: a subpixel electrode; an opposite electrode; and an intermediate layer between the subpixel electrode and the opposite electrode; an encapsulation layer over the light emitting diode, and including: a first inorganic encapsulation layer; a second inorganic encapsulation layer; and an organic encapsulation layer between the first inorganic encapsulation layer and the second inorganic encapsulation layer; a first partition wall and a second partition wall located at the third area in a direction from the second area toward the first area; a first separator located between the second partition wall and the first area; a second separator located between the first separator and the first area; and a first groove defined between the first separator and the second separator. Each of the first separator and the second separator includes: a first metal pattern layer over the substrate; a first inorganic pattern layer over the first metal pattern layer; a second metal pattern layer over the first inorganic pattern layer; a second inorganic pattern layer over the second metal pattern layer; a third metal pattern layer over the second inorganic pattern layer; and a third inorganic pattern layer over the third metal pattern layer. An end portion of each of the first, second, and third inorganic pattern layers includes a tip extending toward a center of the first groove.

In an embodiment, the tip of the first inorganic pattern layer may include a first tip extending toward the center of the first groove from a point where a side surface of the first metal pattern layer and a lower surface of the first inorganic pattern layer meet each other, the tip of the second inorganic pattern layer may include a second tip extending toward the center of the first groove from a point where a side surface of the second metal pattern layer and a lower surface of the second inorganic pattern layer meet each other, and the tip of the third inorganic pattern layer may include a third tip extending toward the center of the first groove from a point where a side surface of the third metal pattern layer and a lower surface of the third inorganic pattern layer meet each other.

In an embodiment, the first inorganic pattern layer may have a greater width than that of the first metal pattern layer, the second inorganic pattern layer may have a greater width than those of the second metal pattern layer and the third metal pattern layer, and the third inorganic pattern layer may have a greater width than that of the third metal pattern layer.

In an embodiment, the display panel may further include a lower layer at the third area under the first groove, and an upper surface of the lower layer may correspond to a bottom surface of the first groove.

In an embodiment, the display panel may further include a subpixel circuit unit electrically connected to the light emitting diode, the subpixel circuit unit including: a first thin film transistor including a silicon-based semiconductor layer, and a first gate electrode at least partially overlapping with the silicon-based semiconductor layer; a second thin film transistor including an oxide-based semiconductor layer, and a second gate electrode at least partially overlapping with the oxide-based semiconductor layer; a capacitor electrode at least partially overlapping with the first gate electrode of the first thin film transistor; and a plurality of inorganic insulating layers over the silicon-based semiconductor layer, the oxide-based semiconductor layer, the first gate electrode, the second gate electrode, or the capacitor electrode.

In an embodiment, the lower layer may include a same material as that of the silicon-based semiconductor layer.

In an embodiment, each of the first, second, and third metal pattern layers may include a same material as that of any one of the first gate electrode, the second gate electrode, or the capacitor electrode, and each of the first, second, and third inorganic pattern layers may include a same material as that of any one of the plurality of inorganic insulating layers.

In an embodiment, the display panel may further include: a third separator between the first partition wall and the second partition wall; and a second groove defined between the first partition wall and the third separator, or between the third separator and the second partition wall. At least a portion of the organic encapsulation layer may fill the second groove.

In an embodiment, a first portion of the first inorganic encapsulation layer and a first portion of the second inorganic encapsulation layer may directly contact each other on the second partition wall.

In an embodiment, a second portion of the first inorganic encapsulation layer and a second portion of the second inorganic encapsulation layer may directly contact each other on the first separator or the second separator.

In an embodiment, each of the first separator and the second separator may include a fourth metal pattern layer over the third inorganic pattern layer, the fourth metal pattern layer may include a first sublayer, a second sublayer, and a third sublayer that are sequentially stacked on one another, and the third sublayer may include a tip extending toward the center of the first groove from a point where a side surface of the second sublayer and a lower surface of the third sublayer meet each other.

In an embodiment, the first sublayer and the third sublayer may include a same material as each other, and the second sublayer may include a different material from that of the first sublayer and the third sublayer.

In an embodiment, the intermediate layer may include at least one organic material layer, and the at least one organic material layer and the opposite electrode may be disconnected or separated by the first separator and the second separator at the third area.

According to one or more embodiments of the present disclosure, a display panel includes: a substrate including: a first area; a second area surrounding at least a portion of the first area; and a third area between the first area and the second area; a light emitting diode at the second area, and including: a subpixel electrode; an opposite electrode; and an intermediate layer between the subpixel electrode and the opposite electrode; an encapsulation layer over the light emitting diode, and including: a first inorganic encapsulation layer; a second inorganic encapsulation layer; and an organic encapsulation layer between the first inorganic encapsulation layer and the second inorganic encapsulation layer; a partition wall located at the third area; and a first separator located between the partition wall and the first area. The first separator includes: a first metal pattern layer over the substrate; a first inorganic pattern layer over the first metal pattern layer; a second metal pattern layer over the first inorganic pattern layer; a second inorganic pattern layer over the second metal pattern layer; a third metal pattern layer over the second inorganic pattern layer; and a third inorganic pattern layer over the third metal pattern layer. An end portion of each of the first, second, and third inorganic pattern layers includes a tip protruding more laterally than a corresponding layer located directly thereunder.

In an embodiment, the tip of the first inorganic pattern layer may include a first tip protruding laterally from a point where a side surface of the first metal pattern layer and a lower surface of the first inorganic pattern layer meet each other, the tip of the second inorganic pattern layer may include a second tip protruding laterally from a point where a side surface of the second metal pattern layer and a lower surface of the second inorganic pattern layer meet each other, and the tip of the third inorganic pattern layer may include a third tip protruding laterally from a point where a side surface of the third metal pattern layer and a lower surface of the third inorganic pattern layer meet each other.

In an embodiment, the display panel may further include a subpixel circuit unit electrically connected to the light emitting diode, the subpixel circuit unit including: a first thin film transistor including a silicon-based semiconductor layer, and a first gate electrode at least partially overlapping with the silicon-based semiconductor layer; a second thin film transistor including an oxide-based semiconductor layer, and a second gate electrode at least partially overlapping with the oxide-based semiconductor layer; a capacitor electrode at least partially overlapping with the first gate electrode of the first thin film transistor; and a plurality of inorganic insulating layers over the silicon-based semiconductor layer, the oxide-based semiconductor layer, the first gate electrode, the second gate electrode, or the capacitor electrode.

In an embodiment, each of the first, second, and third metal pattern layers may include a same material as that of any one of the first gate electrode, the second gate electrode, or the capacitor electrode, and each of the first, second, and third inorganic pattern layers may include a same material as any one of the plurality of inorganic insulating layers.

In an embodiment, the display panel may further include a second separator located at the third area between the second area and the partition wall, and at least a portion of the organic encapsulation layer may cover the second separator.

In an embodiment, the first separator may include a fourth metal pattern layer over the third inorganic pattern layer, the fourth metal pattern layer may include a first sublayer, a second sublayer, and a third sublayer that are sequentially stacked on one another, and the third sublayer may include a tip protruding laterally from a point where a side surface of the second sublayer and a lower surface of the third sublayer meet each other.

In an embodiment, the first sublayer and the third sublayer may include a same material as each other, and the second sublayer may include a different material from that of the first sublayer and the third sublayer.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIGS. 8A-8D are cross-sectional views illustrating processes of a manufacturing method of a display panel according to an embodiment;

DETAILED DESCRIPTION

Figure 1:
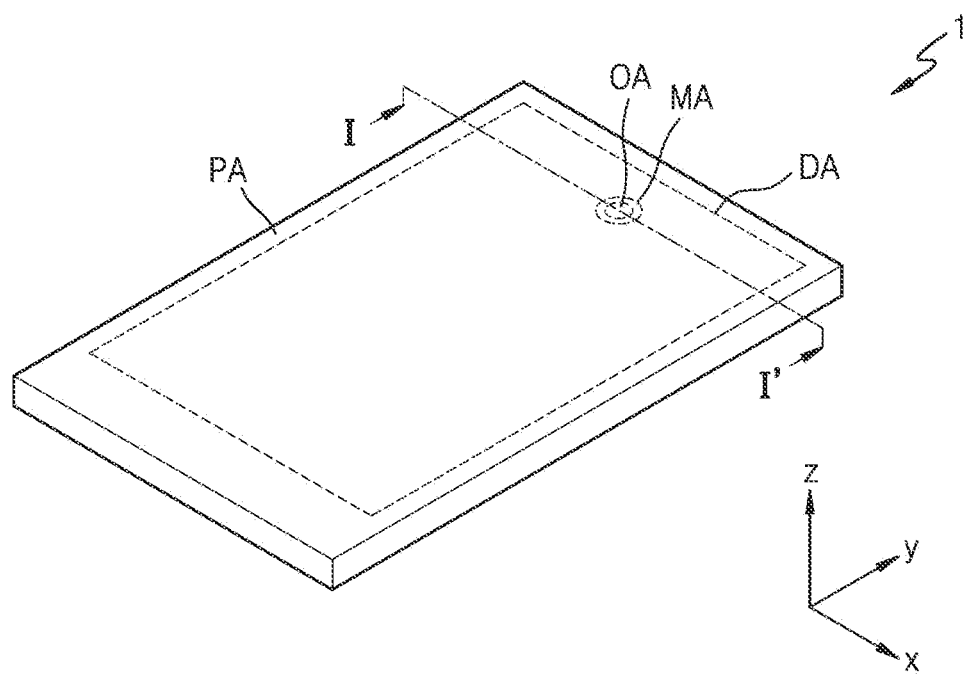
FIG. 1 is a perspective view schematically illustrating an electronic apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

As used herein, when a line is described as "extending in a first direction or a second direction" the line may extend in a linear shape, a zigzag shape, or a curved shape along the first direction or the second direction, unless otherwise specifically described.

Further, the expression "in a plan view" may refer to a view of a target portion from above, and the expression "in a cross-sectional view" may refer to a cross-section of a target portion that is vertically cut and viewed from the side. As used herein, the expressions "overlap with" and "overlapping with" may include two objects or portions thereof that overlap with each other "in a plan view" and/or "in a cross-sectional view."

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view schematically illustrating an electronic apparatus according to an embodiment.

Referring to FIG. 1, an electronic apparatus 1 may be an apparatus for displaying a moving image and/or a still image. The electronic apparatus 1 may be used as a display screen of various suitable products, such as televisions, notebook computers, monitors, billboards, and Internet of Things (IoT) devices, as well as various suitable portable electronic apparatuses, such as mobile phones, smartphones, tablet personal computers, mobile communication terminals, electronic notebooks, electronic books, portable multimedia players (PMPs), navigation devices, and Ultra Mobile personal computers (UMPCs). The electronic apparatus 1 according to an embodiment may be used in wearable devices, such as smart watches, watch phones, glasses-type displays, and head-mounted displays (HMDs). The electronic apparatus 1 according to an embodiment may be used as a center information display (CID) arranged at a vehicle's instrument panel or a vehicle's center fascia or dashboard, a room mirror display replacing a vehicle's side mirror, or a display arranged at a rear side of a vehicle's front seat as entertainment for a vehicle's rear seat. For convenience of illustration, FIG. 1 shows the electronic apparatus 1 that is used as a smartphone, according to an embodiment.

The electronic apparatus 1 may be formed in a rectangular shape in a plan view. For example, the electronic apparatus 1 may have a rectangular planar shape having a short side extending in the x direction, and a long side extending in the y direction as illustrated in FIG. 1. An edge where the short side extending in the x direction and the long side extending in the y direction meet each other may be formed in a rounded shape having a suitable curvature (e.g., a predetermined or certain curvature), or may be formed in a right-angled shape. The planar shape of the electronic apparatus 1 is not limited to the rectangular shape, and may be any other suitable polygonal shape, an elliptical shape, or an irregular shape.

The electronic apparatus 1 may include an opening area OA (e.g., a first area), and a display area DA (e.g., a second area) at least partially surrounding (e.g., around a periphery of) the opening area OA. The electronic apparatus 1 may include an intermediate area MA (e.g., a third area) located between the opening area OA and the display area DA, and a peripheral area PA (e.g., a fourth area) outside the display area DA, for example, such as around, adjacent to or surrounding around a periphery of) the display area DA. The intermediate area MA may have a closed-loop shape entirely surrounding (e.g., around a periphery of) the opening area OA in the plan view.

The opening area OA may be located inside (e.g., within) the display area DA. In an embodiment, the opening area OA may be arranged at an upper center of the display area DA as illustrated in FIG. 1. In other examples, the opening area OA may be variously arranged, such as being arranged at an upper left of the display area DA, or arranged at an upper right of the display area DA. FIG. 1 illustrates that one opening area OA is arranged, however, in another embodiment, a plurality of opening areas OA may be provided and arranged.

Figure 2:
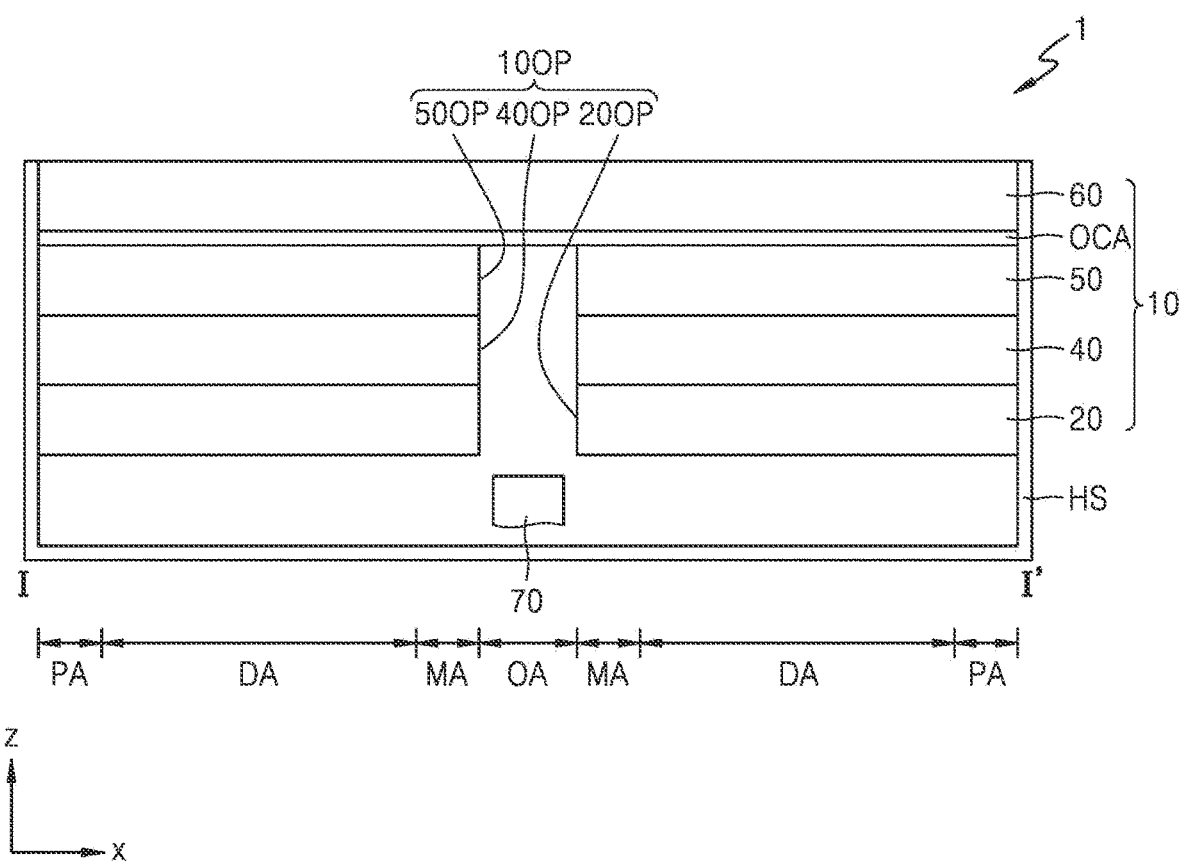
FIG. 2 is a simplified cross-sectional view of an electronic apparatus taken along the line I-I' of FIG. 1, according to an embodiment.

FIG. 2 is a simplified cross-sectional view of an electronic apparatus taken along the line I-I' of FIG. 1, according to an embodiment.

Referring to FIG. 2, the electronic apparatus 1 may include a display panel 10, and a component 70 arranged in the opening area OA of the display panel 10. The display panel 10 and the component 70 may be accommodated in a housing HS.

The display panel 10 may include an image generating layer 20, an input sensing layer 40, an optical functional layer 50, and a cover window 60.

The image generating layer 20 may include display elements (e.g., light emitting elements) that emit light to display an image. The display element may include a light emitting diode, for example, such as an organic light emitting diode including an organic emission layer. In another embodiment, the light emitting diode may be an inorganic light emitting diode including an inorganic material. The inorganic light emitting diode may include a PN junction diode including inorganic semiconductor-based materials. When a voltage is applied to the PN junction diode in a forward direction, holes and electrons may be injected, and energy generated by recombination of the holes and electrons may be converted into light energy to emit light of a suitable color (e.g., a predetermined or certain color). The inorganic light emitting diode may have a width of several to several hundred micrometers, or several to several hundred nanometers. In some embodiments, the image generating layer 20 may include a quantum dot light emitting diode. For example, an emission layer of the image generating layer 20 may include an organic material, an inorganic material, quantum dots, an organic material and quantum dots, or an inorganic material and quantum dots.

The input sensing layer 40 may be configured to acquire coordinate information according to an external input, for example, such as a touch event. The input sensing layer 40 may include a sensing electrode (e.g., a touch electrode), and signal lines (e.g., trace lines) connected to the sensing electrode. The input sensing layer 40 may be disposed over the display element layer 20. The input sensing layer 40 may be configured to sense an external input by a mutual capacitance method and/or a self-capacitance method.

The input sensing layer 40 may be directly formed over the image generating layer 20, or may be separately formed and then coupled (e.g., connected or attached) thereto through an adhesive layer, such as an optical clear adhesive. For example, the input sensing layer 40 may be continuously formed after a process of forming the image generating layer 20, and in this case, an adhesive layer may not be arranged between the input sensing layer 40 and the image generating layer 20. FIG. 2 illustrates that the input sensing layer 40 is arranged between the image generating layer 20 and the optical functional layer 50, however, in another embodiment, the input sensing layer 40 may be disposed over the optical functional layer 50.

The optical functional layer 50 may include an anti-reflection layer. The anti-reflection layer may be configured to reduce a reflectance of light (e.g., external light) incident from the outside through the cover window 60 toward the display panel 10. The anti-reflection layer may include a phase retarder and a polarizer. In another embodiment, the anti-reflection layer may include a black matrix and color filters. The color filters may be arranged according to (e.g., considering) the color of light emitted from each of the light emitting diodes of the image generating layer 20.

In order to improve the transmittance of the opening area OA, the display panel 10 may include an opening 100P passing through (e.g., penetrating) some of the layers constituting the display panel 10. The opening 100P may include first, second, and third openings 200P, 400P, and 500P passing through (e.g., penetrating) the image generating layer 20, the input sensing layer 40, and the optical functional layer 50, respectively. The first opening 200P of the image generating layer 20, the second opening 400P of the input sensing layer 40, and the third opening 500P of the optical function layer 50 may overlap with each other to form the opening 100P of the display panel 10.

The cover window 60 may be disposed over the optical functional layer 50. The cover window 60 may be coupled to (e.g., connected to or attached to) the optical functional layer 50 through an adhesive layer, such as an optical clear adhesive OCA, arranged therebetween. The cover window 60 may cover the first opening 200P of the image generating layer 20, the second opening 400P of the input sensing layer 40, and the third opening 500P of the optical function layer 50.

The cover window 60 may include a glass material or a plastic material. The glass material may include ultra-thin glass. The plastic material may include polyether sulfone, polyacrylate, polyether imide, polyethylene naphthalate, polyethylene terephthalate, polyphenylene sulfide, polyarylate, polyimide, polycarbonate, or cellulose acetate propionate.

The opening area OA may be a kind of component area (e.g., a sensor area, a camera area, or a speaker area), in which the component 70 for adding various suitable functions to the display apparatus 1 is located.

The component 70 may include an electronic element. For example, the component 70 may include an electronic element that uses light or sound. For example, the electronic element may include a sensor, such as an infrared sensor that uses light, a camera for receiving light to obtain an image, a sensor for outputting and sensing light or sound to measure a distance, recognize a fingerprint, or the like, a miniature lamp for outputting light, or a speaker for outputting sound. In the case of an electronic element that uses light, the electronic element may use light of various suitable wavelength bands, such as visible light, infrared light, and/or ultraviolet light. The opening area OA may correspond to an area through which light and/or sound output from the component 70 to the outside or propagating from the outside toward the electronic element may be transmitted.

Figure 3:
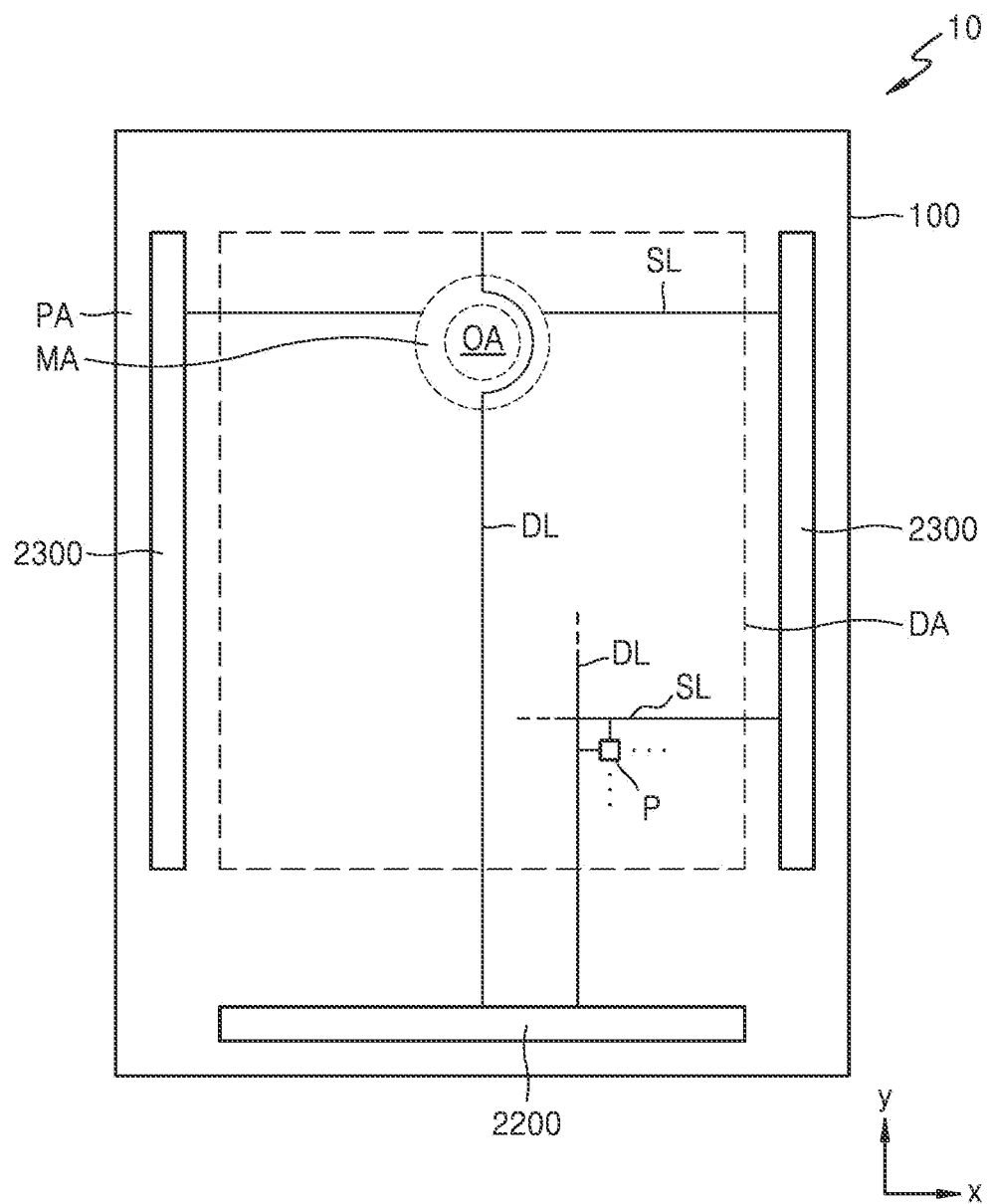
FIG. 3 is a plan view schematically illustrating a display panel according to an embodiment.

FIG. 3 is a plan view schematically illustrating a display panel according to an embodiment.

Referring to FIG. 3, the display panel 10 may include an opening area OA, a display area DA, an intermediate area MA, and a peripheral area PA.

The display panel 10 may include a plurality of subpixels P arranged at (e.g., in or on) the display area DA. The display panel 10 may display an image by using light emitted from the subpixels (e.g., from each of the subpixels) P. Each subpixel P may emit red, green, or blue light by using a light emitting diode. The light emitting diode of each subpixel P may be electrically connected to a corresponding scan line SL and a corresponding data line DL.

A scan driver 2300 for providing a scan signal to each subpixel P, a data driver 2200 for providing a data signal to each subpixel P, a first main power line for providing a first power voltage, and a second main power line for providing a second power voltage may be arranged at (e.g., in or on) the peripheral area PA. The scan driver 2300 may be arranged at (e.g., in or on) each of opposite sides of the peripheral area PA with the display area DA therebetween. In this case, the subpixel P arranged on the left side of the opening area OA may be connected to the scan driver 2300 arranged on the left side, and the subpixel P arranged on the right side of the opening area OA may be connected to the scan driver 2300 arranged on the right side.

The intermediate area MA may surround (e.g., around a periphery of) the opening area OA. The intermediate area MA may be an area in which a display element, such as a light emitting diode for emitting light, is not arranged. Signal lines for providing signals to the subpixels P provided around the opening area OA may pass through the intermediate area MA. For example, data lines DL and/or scan lines SL may cross with the display area DA, and some portions of the data lines DL and/or the scan lines SL may bypass the intermediate area MA along an edge of the opening 100P of the display panel 10 formed in the opening area OA. In an embodiment, FIG. 3 illustrates that the data lines DL cross with the display area DA in the y direction, and some of the data lines DL bypass and partially surround (e.g., around a periphery of) the opening area OA at (e.g., in or on) the intermediate area MA. The scan lines SL may cross with the display area DA in the x direction, and portions of some of the scan lines SL may be spaced apart from each other with the opening area OA therebetween.

FIG. 3 illustrates that the data driver 2200 is arranged adjacent to one side of the substrate 100. However, in another embodiment, the data driver 2200 may be disposed over a printed circuit board that is electrically connected to a pad arranged on one side of the display panel 10. The printed circuit board may be flexible, and a portion of the printed circuit board may be bent to be located under the rear surface of the substrate 100.

Figure 4:
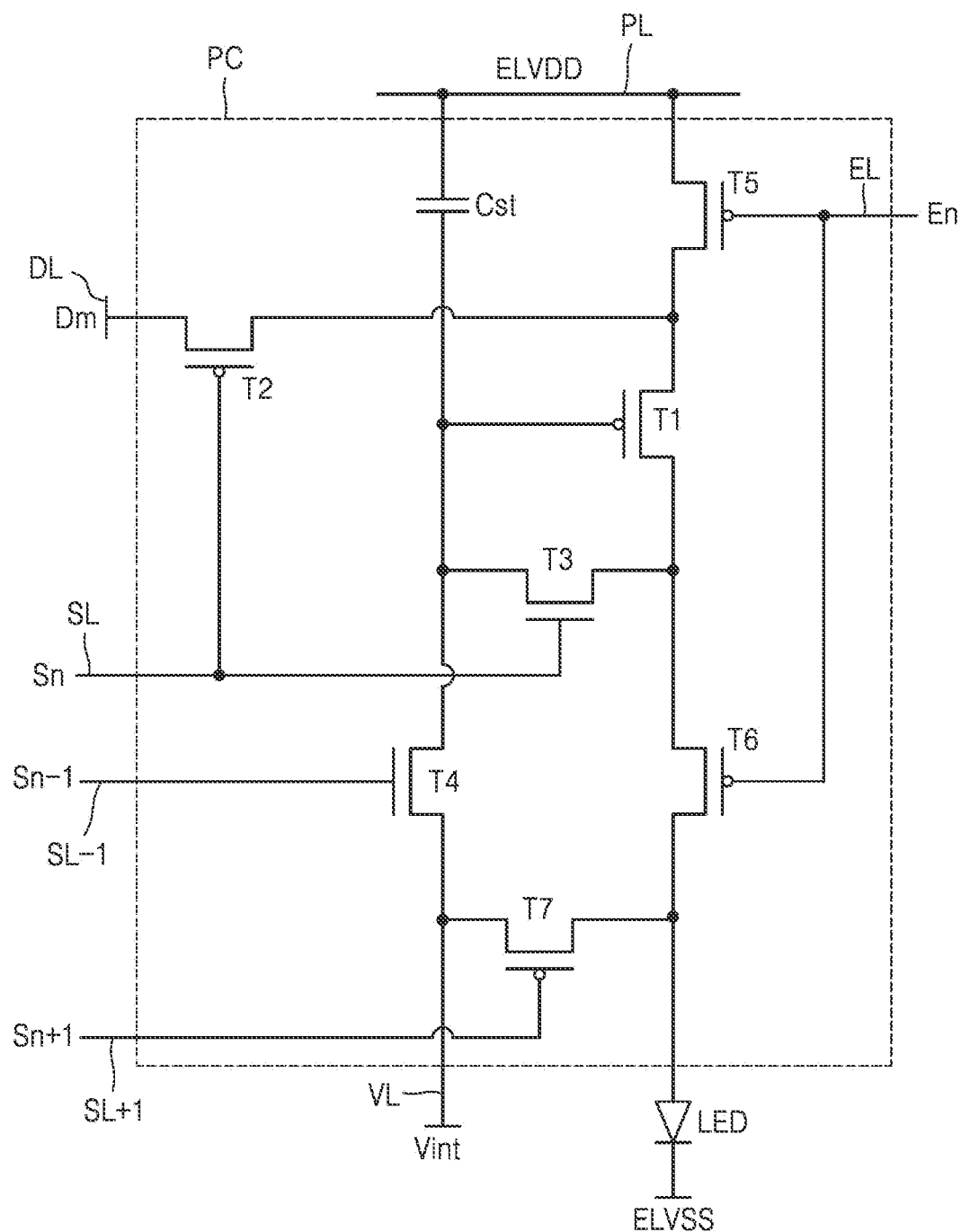
FIG. 4 is an equivalent circuit diagram schematically illustrating a subpixel circuit, and a light emitting diode connected to the subpixel circuit, according to an embodiment.

FIG. 4 is an equivalent circuit diagram schematically illustrating a subpixel circuit, and a light emitting diode connected to the subpixel circuit, according to an embodiment.

Referring to FIG. 4, the subpixel P, which has been described above with reference to FIG. 3, may emit light through a light emitting diode LED, and the light emitting diode LED may be electrically connected to a subpixel circuit PC.

The subpixel circuit PC may include a plurality of thin film transistors T1 to T7, and a storage capacitor Cst. In an embodiment, the plurality of thin film transistors T1 to T7 may include a driving transistor T1, a switching transistor T2, a compensation transistor T3, a first initialization transistor T4, an operation control transistor T5, an emission control transistor T6, and a second initialization transistor T7. However, the present disclosure is not limited thereto.

The switching transistor T2 may be connected to a scan line SL and a data line DL. The switching transistor T2 may be configured to transmit a data voltage (e.g., a data signal) Dm input from the data line DL to the driving transistor T1, based on a switching voltage (e.g., a switching signal) Sn input from the scan line SL. The storage capacitor Cst may be connected to the switching transistor T2 and a driving voltage line PL, and may store a voltage corresponding to a difference between a voltage received from the switching transistor T2 and a first power voltage (e.g., a driving voltage) ELVDD supplied to the driving voltage line PL.

The driving transistor T1 may be connected to the driving voltage line PL and the storage capacitor Cst, and may control a driving current flowing from the driving voltage line PL through the light emitting diode LED in response to a voltage value stored in the storage capacitor Cst. The light emitting diode LED may emit light having a desired brightness (e.g., a predetermined or certain brightness) according to the driving current. The opposite electrode of the light emitting diode LED may be supplied with a second power voltage (e.g., a common voltage) ELVSS.

The gate electrode of the compensation transistor T3 may be connected to the scan line SL. The source electrode (or the drain electrode) of the compensation transistor T3 may be connected to the drain electrode (or the source electrode) of the driving transistor T1, and may be connected to the subpixel electrode of the light emitting diode LED via the emission control transistor T6. The drain electrode (or source electrode) of the compensation transistor T3 may be connected to any one electrode of the storage capacitor Cst, the source electrode (or the drain electrode) of the first initialization transistor T4, and the gate electrode of the driving transistor T1. The compensation transistor T3 may be turned on according to the scan signal Sn received through the scan line SL, and may connect the gate electrode and the drain electrode of the driving transistor T1 to each other to diode-connect the driving transistor T1.

The gate electrode of the first initialization transistor T4 may be connected to a previous scan line SL−1. The drain electrode (or the source electrode) of the first initialization transistor T4 may be connected to an initialization voltage line VL. The source electrode (or the drain electrode) of the first initialization transistor T4 may be connected to any one electrode of the storage capacitor Cst, the drain electrode (or the source electrode) of the compensation transistor T3, and the gate electrode of the driving transistor T1. The first initialization transistor T4 may be turned on according to a previous scan signal Sn−1 received through the previous scan line SL−1, and may transmit an initialization voltage Vint to the gate electrode of the driving transistor T1 to perform an initialization operation of initializing the voltage of the gate electrode of the driving transistor T1.

The gate electrode of the operation control transistor T5 may be connected to an emission control line EL. The source electrode (or the drain electrode) of the operation control transistor T5 may be connected to the driving voltage line PL. The drain electrode (or the source electrode) of the operation control transistor T5 may be connected to the source electrode (or the drain electrode) of the driving transistor T1 and the drain electrode (or the source electrode) of the switching transistor T2.

The gate electrode of the emission control transistor T6 may be connected to the emission control line EL. The source electrode (or the drain electrode) of the emission control transistor T6 may be connected to the drain electrode (or the source electrode) of the driving transistor T1 and the source electrode (or the drain electrode) of the compensation transistor T3. The drain electrode (or the source electrode) of the emission control transistor T6 may be electrically connected to the subpixel electrode of the light emitting diode LED. The operation control transistor T5 and the emission control transistor T6 may be concurrently (e.g., simultaneously or substantially simultaneously) turned on with each other according to an emission control signal En received through the emission control line EL, such that the driving voltage ELVDD may be transmitted to the light emitting diode LED, and the driving current may flow through the light emitting diode LED.

The second initialization transistor T7 may initialize the subpixel electrode of the light emitting diode LED. The gate electrode of the second initialization transistor T7 may be connected to a next scan line SL+1. The source electrode (or the drain electrode) of the second initialization transistor T7 may be connected to the subpixel electrode of the light emitting diode LED. The drain electrode (or the source electrode) of the second initialization transistor T7 may be connected to the initialization voltage line VL. The second initialization transistor T7 may be turned on according to a next scan signal Sn+1 received through the next scan line SL+1, and may initialize the subpixel electrode of the light emitting diode LED.

The other electrode of the storage capacitor Cst may be connected to the driving voltage line PL. Any one electrode of the storage capacitor Cst may be connected to the gate electrode of the driving transistor T1, the drain electrode (or the source electrode) of the compensation transistor T3, and the source electrode (or the drain electrode) of the first initialization transistor T4.

The opposite electrode of the light emitting diode LED may be provided with the second power voltage (e.g., the common voltage) ELVSS. The light emitting diode LED may emit light by receiving the driving current from the driving transistor T1.

At least one of the plurality of thin film transistors T1 to T7 of the subpixel circuit PC may include a semiconductor layer including an oxide, and the others of the plurality of thin film transistors T1 to T7 may include a semiconductor layer including silicon. FIG. 4 illustrates that the compensation transistor T3 and the first initialization transistor T4 are implemented as n-channel MOSFETs (e.g., NMOSs), and the driving transistor T1, the switching transistor T2, the operation control transistor T5, the emission control transistor T6, and the second initialization transistor T7 are implemented as p-channel MOSFETs (e.g., PMOSs). In another embodiment, the compensation transistor T3 may be implemented as an NMOS, and the driving transistor T1, the switching transistor T2, the first initialization transistor T4, the operation control transistor T5, the emission control transistor T6, and the second initialization transistor T7 may be implemented as PMOSs.

In more detail, the driving transistor T1 directly affecting the brightness of the display apparatus may be configured to include a semiconductor layer including polycrystalline silicon having high reliability, and accordingly, a high-resolution display apparatus may be implemented.

Because an oxide semiconductor may have a high carrier mobility and a low leakage current, a voltage drop thereof may not be great, even when a driving time thereof is long. In other words, low-frequency driving may be possible because a color change of an image due to a voltage drop may not be great, even in the case of low-frequency driving. As such, because an oxide semiconductor has a small leakage current, at least one of the first initialization transistor T4 or the compensation transistor T3 that are connected to the gate electrode of the driving transistor T1 may include an oxide semiconductor to reduce power consumption, while preventing or substantially preventing a leakage current that may flow to the gate electrode of the driving transistor T1.

Figure 5:
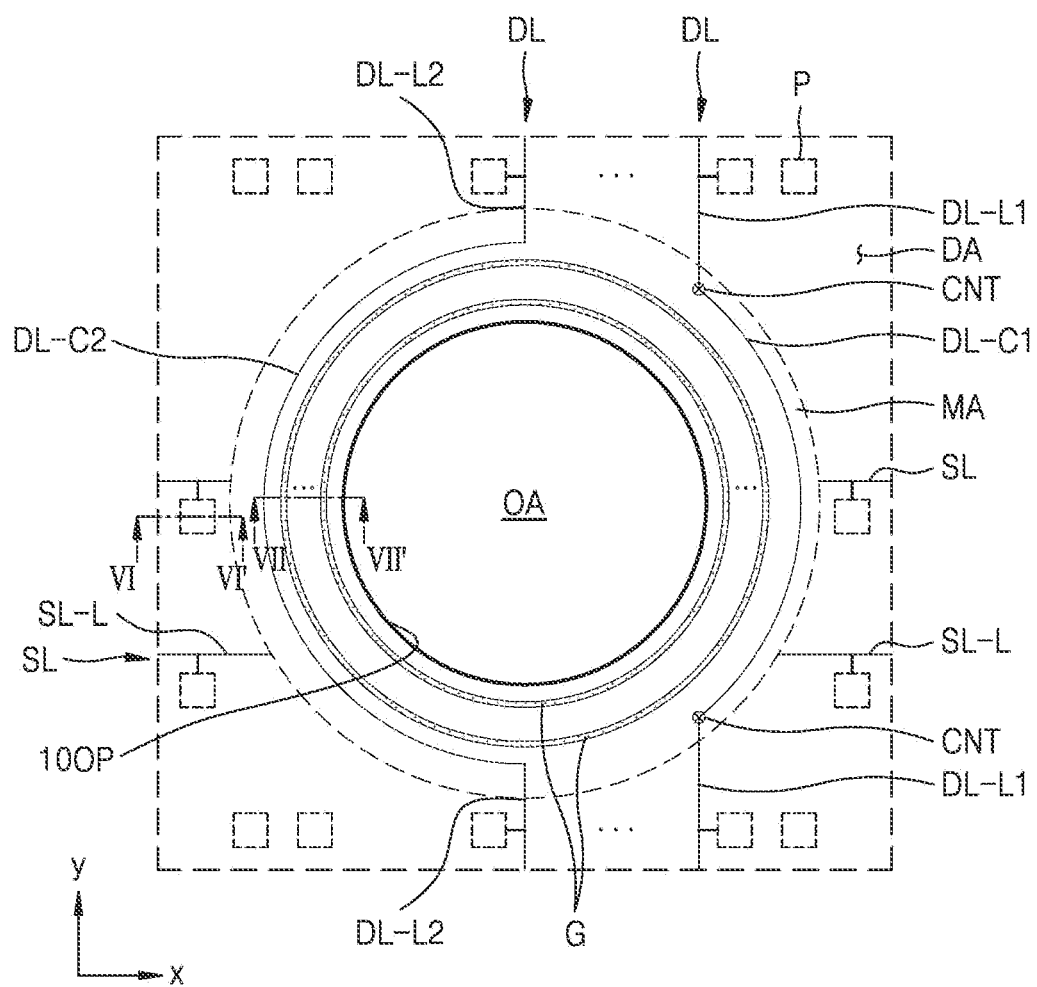
FIG. 5 is a plan view illustrating an enlarged portion of a display panel according to an embodiment.

FIG. 5 is a plan view illustrating an enlarged portion of a display panel according to an embodiment.

Referring to FIG. 5, the subpixels P may be arranged at (e.g., in or on) the display area DA. The intermediate area MA may be located between the opening area OA and the display area DA. The subpixels P that are adjacent to the opening area OA may be arranged to be spaced apart from each other around the opening area OA in the plan view.

In the plan view of FIG. 5, the subpixels P may be arranged vertically to be spaced apart from each other around the opening area OA, or may be arranged horizontally to be spaced apart from each other around the opening area OA. Because each subpixel P uses red, green, or blue light emitted from a corresponding light emitting diode, the positions of the subpixels P illustrated in FIG. 5 may correspond to the positions of the light emitting diodes, respectively. In other words, that the subpixels P are arranged to be spaced apart from each other around the opening area OA in the plan view may be understood as the light emitting diodes are arranged to be spaced apart from each other around the opening area OA in the plan view. For example, in the plan view, the light emitting diodes may be arranged to be vertically spaced apart from each other around the opening area OA, or may be arranged to be horizontally spaced apart from each other around the opening area OA.

From among the signal lines for supplying signals to the subpixel circuit connected to the light emitting diode of each subpixel P, the signal lines that are adjacent to the opening area OA may bypass the opening area OA and/or the opening 100P. From among the data lines passing through the display area DA, some of the data lines DL may extend in the ±y direction to provide data signals to the subpixels P disposed over and under (e.g., above and below) the opening area OA, and may bypass the opening area OA and/or the opening 100P along an edge of the opening area OA and/or the opening 100P at (e.g., in or on) the intermediate area MA.

A bypass portion DL-C1 of at least one data line from among the data lines DL may be formed at (e.g., in or on) a different layer from that of an extension portion DL-L1 crossing with the display area DA. The extension portion DL-L1 and the bypass portion DL-C1 of the data line DL may be connected to each other through a contact hole CNT. A bypass portion DL-C2 of at least one data line from among the data lines DL may be located at (e.g., in or on) the same layer as that of an extension portion DL-L2, and may be integrally formed therewith.

The scan lines SL (e.g., portions of some of the scan lines) may be separated or disconnected around the opening area OA. The scan line SL arranged on the left side of the opening area OA may receive a signal from the scan driver 2300 arranged on the left side of the display area DA as described above with reference to FIG. 3. The scan line SL arranged on the right side of the opening area OA may receive a signal from the scan driver 2300 arranged on the right side of the display area DA as illustrated in FIG. 3.

Grooves G may be located between the opening area OA and an area of the intermediate area MA that is bypassed by the data lines DL. In the plan view, each of the grooves G may have a closed-loop shape surrounding (e.g., around a periphery of) the opening area OA, and the grooves G may be arranged to be spaced apart from each other.

Figure 6:
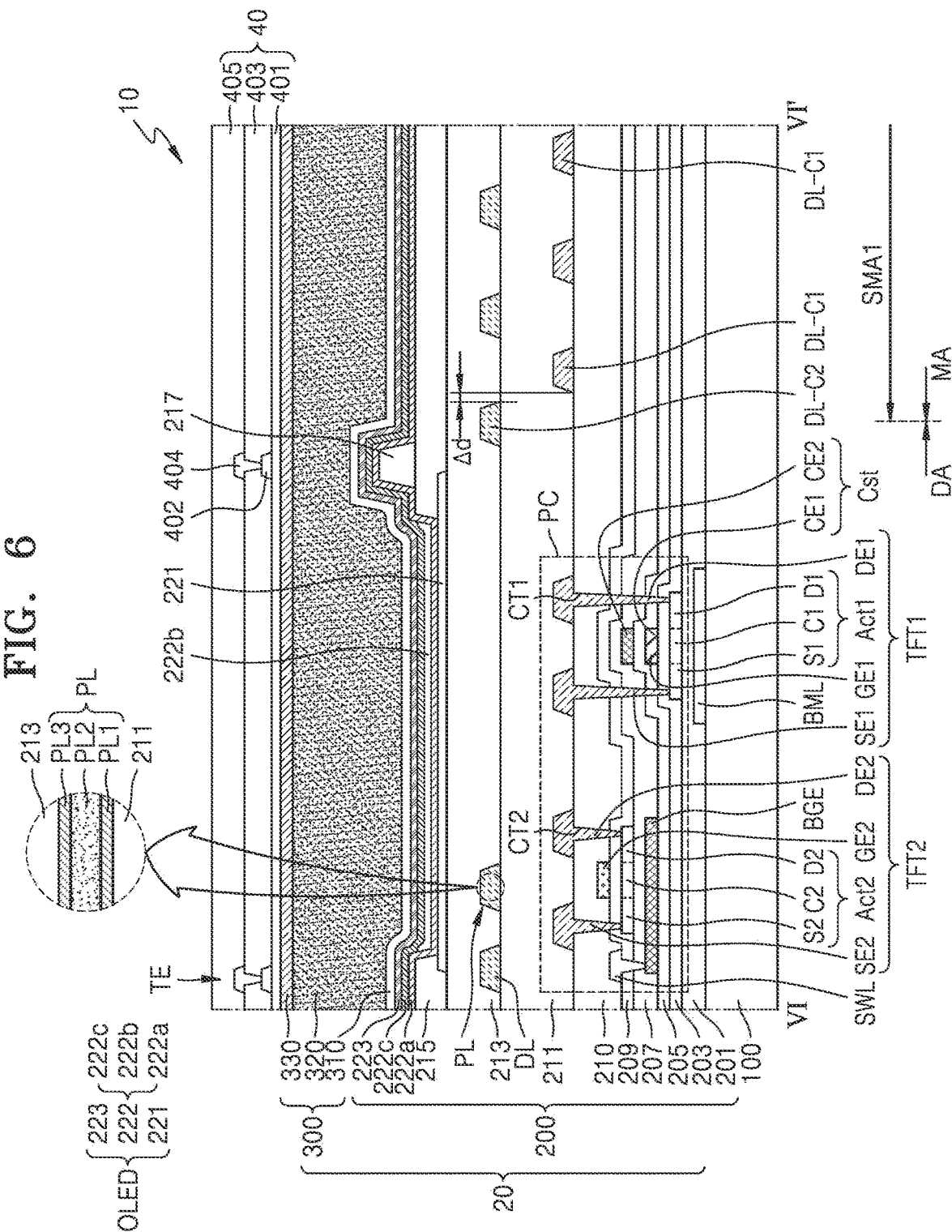
FIG. 6 is a cross-sectional view of a display panel taken along the line VI-VI' of FIG. 5, according to an embodiment.

FIG. 6 is a cross-sectional view of a display panel taken along the line VI-VI' of FIG. 5, according to an embodiment.

Referring to the display area DA illustrated in FIG. 6, the display panel 10 may include the substrate 100, an image generating layer 20 disposed over the substrate 100, and an input sensing layer 40 over the image generating layer 20. The image generating layer 20 may include a circuit-diode layer 200 and an encapsulation layer 300. The circuit-diode layer 200 may include the subpixel circuit PC and an organic light emitting diode OLED.

The circuit-diode layer 200 may include a subpixel circuit unit including the subpixel circuit PC, and a plurality of insulating layers disposed over or under the components of the subpixel circuit PC. The plurality of insulating layers may include inorganic insulating layers and organic insulating layers. The inorganic insulating layers may include, for example, a buffer layer 201, a first gate insulating layer 203, a second gate insulating layer 205, a first interlayer insulating layer 207, a third gate insulating layer 209, and a second interlayer insulating layer 210. The organic insulating layers may include, for example, a first organic insulating layer 211 and a second organic insulating layer 213.

The substrate 100 may include a glass material or a polymer resin. In an embodiment, the substrate 100 may include an alternating stacked structure of a base layer including a polymer resin, and a barrier layer including an inorganic insulating material, such as silicon oxide or silicon nitride. The polymer resin may include, for example, polyether sulfone, polyarylate, polyether imide, polyethylene naphthalate, polyethylene terephthalate, polyphenylene sulfide, polyimide, polycarbonate, cellulose triacetate, or cellulose acetate propionate.

The subpixel circuit PC may be formed over the substrate 100, and the light emitting diode, for example, such as the organic light emitting diode OLED, may be disposed over the subpixel circuit PC.

Before the subpixel circuit PC is formed, the buffer layer 201 for preventing or substantially preventing impurities from penetrating into the subpixel circuit PC may be formed over the substrate 100. The buffer layer 201 may include an inorganic insulating material, such as silicon nitride, silicon oxynitride, or silicon oxide, and may include a single-layer structure or a multiple-layered structure including one or more of the above inorganic insulating materials.

The subpixel circuit PC may include the plurality of transistors and the storage capacitor as described above with reference to FIG. 4. In this regard, FIG. 6 illustrates a first thin film transistor TFT1, a second thin film transistor TFT2, and the storage capacitor Cst.

The first thin film transistor TFT1 may include a first semiconductor layer Act1, a first gate electrode GE1, a first source electrode SE1, and a first drain electrode DE1. The second thin film transistor TFT2 may include a second semiconductor layer Act2, a second gate electrode GE2, a second source electrode SE2, and a second drain electrode DE2. The storage capacitor Cst may include a first capacitor electrode CE1 and a second capacitor electrode CE2.

The first semiconductor layer Act1 may be a silicon-based semiconductor layer including a silicon semiconductor material. For example, the first semiconductor layer Act1 may include polysilicon. As another example, the first semiconductor layer Act1 may include amorphous silicon. The first semiconductor layer Act1 may include a channel area C1, and a drain area D1 and a source area S1 arranged at (e.g., in or on) opposite sides, respectively, of the channel area C1. The first gate electrode GE1 may overlap with the channel area C1.

The first gate insulating layer 203 may be arranged between the first semiconductor layer Act1 and the first gate electrode GE1. The first gate insulating layer 203 may include an inorganic insulating material, such as silicon oxide, silicon nitride, silicon oxynitride, aluminum oxide, titanium oxide, tantalum oxide, hafnium oxide, and/or zinc oxide, and may include a single-layer structure or a multiple-layered structure including one or more of the above inorganic insulating materials.

The first gate electrode GE1 may include a conductive material including molybdenum (Mo), aluminum (Al), copper (Cu), titanium (Ti), or the like, and may include a single-layer structure or a multiple-layered structure including one or more of the above conductive materials. In an embodiment, the first gate electrode GE1 may include molybdenum (Mo).

The second gate insulating layer 205 may cover the first gate electrode GE1. The second gate insulating layer 205 may be disposed over the first gate electrode GE1. Like the first gate insulating layer 203, the second gate insulating layer 205 may include an inorganic insulating material, such as silicon oxide, silicon nitride, silicon oxynitride, aluminum oxide, titanium oxide, tantalum oxide, hafnium oxide, and/or zinc oxide.

The second capacitor electrode CE2 may be disposed over the second gate insulating layer 205. In an embodiment, the second capacitor electrode CE2 may overlap with the first gate electrode GE1 thereunder. In this case, the second capacitor electrode CE2 and the first gate electrode GE1 may overlap with each other with the second gate insulating layer 205 therebetween, to form the storage capacitor Cst. In other words, the first gate electrode GE1 of the first thin film transistor TFT1 may function as the first capacitor electrode CE1 of the storage capacitor Cst. As such, the storage capacitor Cst and the first thin film transistor TFT1 may be formed to overlap with each other. In another embodiment, the storage capacitor Cst may be formed to not overlap with the first thin film transistor TFT1.

The second capacitor electrode CE2 of the storage capacitor Cst may include a low-resistance conductive material, such as molybdenum (Mo), aluminum (Al), copper (Cu), and/or titanium (Ti), and may include a single-layer structure or a multiple-layered structure including one or more of the above low-resistance conductive materials. In an embodiment, the second capacitor electrode CE2 may include molybdenum (Mo).

The first interlayer insulating layer 207 may be disposed over the storage capacitor Cst. The first interlayer insulating layer 207 may include an inorganic insulating material, such as silicon oxide, silicon nitride, silicon oxynitride, aluminum oxide, titanium oxide, tantalum oxide, hafnium oxide, and/or zinc oxide, and may include a single-layer structure or a multiple-layered structure including one or more of the above inorganic insulating materials.

The second semiconductor layer Act2 may be disposed over the first interlayer insulating layer 207. The second semiconductor layer Act2 may be an oxide-based semiconductor layer including an oxide semiconductor material. For example, the second semiconductor layer Act2 may include a Zn oxide-based material, such as Zn oxide, In—Zn oxide, or Ga—In—Zn oxide. In some embodiments, the second semiconductor layer Act2 may include In—Ga—Zn—O (IGZO), In—Sn—Zn—O (ITZO), or In—Ga—Sn—Zn—O (IGTZO) semiconductor containing a metal, such as indium (In), gallium (Ga), or stannum (Sn) in ZnO.

The second semiconductor layer Act2 may include a channel area C2, and a source area S2 and a drain area D2 arranged at (e.g., in or on) opposite sides, respectively, of the channel area C2. The source area S2 and the drain area D2 may be formed by increasing a carrier concentration in an oxide semiconductor through plasma treatment using hydrogen-based gas, fluorine-based gas, or a combination thereof.

The third gate insulating layer 209 may cover the second semiconductor layer Act2. The third gate insulating layer 209 may be arranged between the second semiconductor layer Act2 and the second gate electrode GE2. The third gate insulating layer 209 may include an inorganic insulating material, such as silicon oxide, silicon nitride, silicon oxynitride, aluminum oxide, titanium oxide, tantalum oxide, hafnium oxide, or zinc oxide. The third gate insulating layer 209 may include a single-layer structure or a multiple-layered structure including one or more of the above inorganic insulating materials.

The second gate electrode GE2 may be disposed over the third gate insulating layer 209. The second gate electrode GE2 may overlap with the second semiconductor layer Act2. The second gate electrode GE2 may overlap with the channel area C2 of the second semiconductor layer Act2. The second gate electrode GE2 may include a conductive material including molybdenum (Mo), aluminum (Al), copper (Cu), titanium (Ti), or the like, and may include a single layer or multiple layers including one or more of the above conductive materials. In an embodiment, the second gate electrode GE2 may include molybdenum (Mo).

The second interlayer insulating layer 210 may cover the second gate electrode GE2. The second interlayer insulating layer 210 may include an inorganic insulating material, such as silicon oxide, silicon nitride, silicon oxynitride, aluminum oxide, titanium oxide, tantalum oxide, hafnium oxide, or zinc oxide. The second interlayer insulating layer 210 may include a single-layer structure or a multiple-layered structure including one or more of the above inorganic insulating materials.

The first source electrode SE1 and the first drain electrode DE1 may be disposed over the second interlayer insulating layer 210. The first source electrode SE1 and the first drain electrode DE1 may be connected to the first semiconductor layer Act1. The first source electrode SE1 and the first drain electrode DE1 may be connected to the first semiconductor layer Act1 through first contact holes CT1 passing through (e.g., penetrating) the insulating layers thereunder. For example, the first source electrode SE1 and the first drain electrode DE1 may be electrically connected to the first semiconductor layer Act1 through the first contact holes CT1 passing through (e.g., penetrating) the first gate insulating layer 203, the second gate insulating layer 205, the first interlayer insulating layer 207, the third gate insulating layer 209, and the second interlayer insulating layer 210.

The second source electrode SE2 and the second drain electrode DE2 may be disposed over the second interlayer insulating layer 210. The second source electrode SE2 and the second drain electrode DE2 may be electrically connected to the second semiconductor layer Act2. The second source electrode SE2 and the second drain electrode DE2 may be electrically connected to the second semiconductor layer Act2 through second contact holes CT2 passing through (e.g., penetrating) the insulating layers thereunder. For example, the second source electrode SE2 and the second drain electrode DE2 may be electrically connected to the second semiconductor layer Act2 through the second contact holes CT2 passing through (e.g., penetrating) the third gate insulating layer 209 and the second interlayer insulating layer 210.

The first source electrode SE1, the first drain electrode DE1, the second source electrode SE2, and the second drain electrode DE2 may include a suitable material having a suitable conductivity (e.g., good conductivity). The first source electrode SE1, the first drain electrode DE1, the second source electrode SE2, and the second drain electrode DE2 may include a conductive material including molybdenum (Mo), aluminum (Al), copper (Cu), titanium (Ti), or the like, and may include a single layer or multiple layers including one or more of the above conductive materials. In an embodiment, the first source electrode SE1, the first drain electrode DE1, the second source electrode SE2, and the second drain electrode DE2 may have a multilayered structure of Ti/Al/Ti.

A bottom gate electrode BGE may be disposed under the second semiconductor layer Act2. In an embodiment, the bottom gate electrode BGE may be arranged between the second gate insulating layer 205 and the first interlayer insulating layer 207. In an embodiment, the bottom gate electrode BGE may receive a gate signal. In this case, the second thin film transistor TFT2 may have a dual-gate electrode structure, in which the gate electrodes thereof are disposed over and under the second semiconductor layer Act2.

The bottom gate electrode BGE may include the same material as that of the second capacitor electrode CE2 of the storage capacitor Cst. The bottom gate electrode BGE may include, for example, a conductive material including molybdenum (Mo), aluminum (Al), copper (Cu), titanium (Ti), or the like, and may include a single layer or multiple layers including one or more of the above conductive materials. In an embodiment, the bottom gate electrode BGE may include molybdenum (Mo).

A subline SWL may be arranged between the third gate insulating layer 209 and the second interlayer insulating layer 210. In an embodiment, the subline SWL may be electrically connected to the bottom gate electrode BGE through a contact hole in (e.g., penetrating) the first interlayer insulating layer 207 and the third gate insulating layer 209.

A back metal layer BML may be arranged between the substrate 100 and the subpixel circuit PC overlapping with the display area DA. In an embodiment, the back metal layer BML may overlap with the first thin film transistor TFT1. A constant or substantially constant voltage may be applied to the back metal layer BML. As the back metal layer BML is disposed under the first thin film transistor TFT1, the first thin film transistor TFT1 may be less affected by ambient interference signals, and thus, reliability thereof may be improved.

The first thin film transistor TFT1 including the first semiconductor layer Act1 including the silicon semiconductor material may be, for example, the driving transistor T1 (e.g., see FIG. 4). The second thin film transistor TFT2 including the second semiconductor layer Act2 including the oxide semiconductor material may be, for example, the compensation transistor T3 (e.g., see FIG. 4).

FIG. 6 illustrates the first thin film transistor TFT1 corresponding to the driving transistor T1, and the second thin film transistor TFT2 corresponding to the compensation transistor T3 from among the plurality of transistors described above with reference to FIG. 4, and illustrates that the first semiconductor layer Act1 and the second semiconductor layer Act2 are arranged at (e.g., in or on) different layers from each other. However, the present disclosure is not limited thereto.

The first, second, fifth, sixth, and seventh transistors T1, T2, T5, T6, and T7 described above with reference to FIG. 4 may have the same or substantially the same structure as that of the first thin film transistor TFT1 described above with reference to FIG. 6. For example, the first, second, fifth, sixth, and seventh transistors T1, T2, T5, T6, and T7 (e.g., see FIG. 4) may include a semiconductor layer arranged at (e.g., in or on) the same layer as that of the first semiconductor layer Act1 of the first thin film transistor TFT1, and a gate electrode arranged at (e.g., in or on) the same layer as that of the first gate electrode GE1 of the first thin film transistor TFT1. The semiconductor layer of the first, second, fifth, sixth, and seventh transistors T1, T2, T5, T6, and T7 (e.g., see FIG. 4) may be integrally connected with that of the first thin film transistor TFT1.

The first initialization transistor T4 described above with reference to FIG. 4 may have the same or substantially the same structure as that of the second thin film transistor TFT2 described above with reference to FIG. 6. For example, the first initialization transistor T4 may include a semiconductor layer arranged at (e.g., in or on) the same layer as that of the second semiconductor layer Act2 of the second thin film transistor TFT2, and a gate electrode formed at (e.g., in or on) the same layer as that of the second gate electrode GE2 of the second thin film transistor TFT2. The semiconductor layer of the first initialization transistor T4 and the second semiconductor layer Act2 of the second thin film transistor TFT2 may be integrally connected to each other.

The first organic insulating layer 211 may be disposed over the first source electrode SE1, the first drain electrode DE1, the second source electrode SE2, and the second drain electrode DE2. The first organic insulating layer 211 may include an organic insulating material. The organic insulating material may include acryl, benzocyclobutene (BCB), polyimide, hexamethyldisiloxane (HMDSO), or the like.

The data line DL and the driving voltage line PL may be disposed over the first organic insulating layer 211, and may be covered by the second organic insulating layer 213. The data line DL and the driving voltage line PL may include aluminum (Al), copper (Cu), and/or titanium (Ti), and may include a single layer or multiple layers including one or more of the above materials. In an embodiment, the driving voltage line PL may include a first layer PL1, a second layer PL2, and a third layer PL3 having a triple-layered structure of Ti/Al/Ti.

The second organic insulating layer 213 may include an organic insulating material, such as acryl, BCB, polyimide, and/or HMDSO. FIG. 6 illustrates that the data line DL and the driving voltage line PL are formed on the first organic insulating layer 211, but the present disclosure is not limited thereto. In another embodiment, any one of the data line DL or the driving voltage line PL may be arranged at (e.g., in or on) the same layer as that of the first source electrode SE1 and the first drain electrode DE1.

The light emitting diode, for example, such as the organic light emitting diode OLED, may be disposed over the second organic insulating layer 213.

A subpixel electrode 221 of the organic light emitting diode OLED may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any suitable compound thereof. In another embodiment, the subpixel electrode 221 may further include a conductive oxide layer over and/or under the reflective layer. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the subpixel electrode 221 may have a triple-layered structure of ITO/Ag/ITO.

A bank layer 215 may be disposed over the subpixel electrode 221. The bank layer 215 may include an opening overlapping with the subpixel electrode 221, and may cover an edge of the subpixel electrode 221. The bank layer 215 may include an organic insulating material.

An intermediate layer 222 may include an emission layer 222b. The intermediate layer 222 may include a first functional layer 222a arranged under the emission layer 222b, and/or a second functional layer 222c arranged over the emission layer 222b. The emission layer 222b may include a high-molecular weight organic material or a low-molecular weight organic material for emitting light of a desired color (e.g., a predetermined or certain color). The second functional layer 222c may include an electron transport layer (ETL) and/or an electron injection layer (EIL). The first functional layer 222a and the second functional layer 222c may include an organic material.

An opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any suitable alloy thereof. As another example, the opposite electrode 223 may further include a layer, such as ITO, IZO, ZnO, or $In_2O_3$, over the (semi) transparent layer including one or more of the above materials.

The emission layer 222b may be formed over the display area DA to overlap with the subpixel electrode 221 through the opening of the bank layer 215. The first functional layer 222a, the second functional layer 222c, and the opposite electrode 223 may extend to be located at (e.g., in or on) the display area DA, as well as at (e.g., in or on) the intermediate area MA.

A spacer 217 may be formed over the bank layer 215. The spacer 217 and the bank layer 215 may be formed together in the same or substantially the same process, or may be separately formed from each other in separate processes. In an embodiment, the spacer 217 may include an organic insulating material, such as polyimide.

The organic light emitting diode OLED may be covered by the encapsulation layer 300. The encapsulation layer 300 may include at least one organic encapsulation layer, and at least one inorganic encapsulation layer. In an embodiment, FIG. 6 illustrates that the encapsulation layer 300 includes first and second inorganic encapsulation layers 310 and 330, and an organic encapsulation layer 320 arranged therebetween.

The first inorganic encapsulation layer 310 and the second inorganic encapsulation layer 330 may include one or more inorganic materials from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may include a single layer or multiple layers including one or more of the above inorganic materials. The organic encapsulation layer 320 may include a polymer-based material. The polymer-based material may include an acryl-based resin, an epoxy-based resin, polyimide, polyethylene, and/or the like. In an embodiment, the organic encapsulation layer 320 may include acrylate.

The first inorganic encapsulation layer 310 and the second inorganic encapsulation layer 330 may have different thicknesses from each other. The thickness of the first inorganic encapsulation layer 310 may be greater than the thickness of the second inorganic encapsulation layer 330. As another example, the thickness of the second inorganic encapsulation layer 330 may be greater than the thickness of the first inorganic encapsulation layer 310, or the first inorganic encapsulation layer 310 and the second inorganic encapsulation layer 330 may have the same or substantially the same thickness as each other.

The input sensing layer 40 may include a first touch insulating layer 401 disposed over the second inorganic encapsulation layer 330, a first conductive layer 402 over the first touch insulating layer 401, a second touch insulating layer 403 over the first conductive layer 402, a second conductive layer 404 over the second touch insulating layer 403, and a third touch insulating layer 405 over the second conductive layer 404.

Each of the first touch insulating layer 401, the second touch insulating layer 403, and the third touch insulating layer 405 may include an inorganic insulating material and/or an organic insulating material. In an embodiment, the first touch insulating layer 401 and the second touch insulating layer 403 include an inorganic insulating material, such as silicon oxide, silicon nitride, and/or silicon oxynitride, and the third touch insulating layer 405 may include an organic insulating material.

A touch electrode TE of the input sensing layer 40 may include a structure in which the first conductive layer 402 and the second conductive layer 404 are connected to each other. As another example, the touch electrode TE may be formed on any one of the first conductive layer 402 or the second conductive layer 404, and may include a metal line provided in the corresponding conductive layer. Each of the first conductive layer 402 and the second conductive layer 404 may include aluminum (Al), copper (Cu), and/or titanium (Ti), and may include a single layer or multiple layers including one or more of the above materials. For example, each of the first conductive layer 402 and the second conductive layer 404 may have a multilayered structure of Ti/Al/Ti.

Referring to the intermediate area MA illustrated in FIG. 6, the intermediate area MA may include a first sub-intermediate area SMA1 through which the bypass portions DL-C1 and DL-C2 of the data lines DL described above with reference to FIG. 5 pass.

The bypass portions DL-C1 and DL-C2 of the data lines DL may be arranged at (e.g., in or on) different layers from each other. Any one of the bypass portions DL-C1 and DL-C2 of the data lines DL that are adjacent to each other may be disposed over the second interlayer insulating layer 210, and another one thereof may be disposed over the first organic insulating layer 211.

When the bypass portions DL-C1 and DL-C2 of the data lines DL are alternately arranged with an insulating layer (e.g., the first organic insulating layer 211) therebetween, a pitch Δd between the bypass portions DL of the data lines DL-C1 and DL-C2 may be reduced, and thus, the area of the intermediate area MA may be efficiently used.

Figure 7:
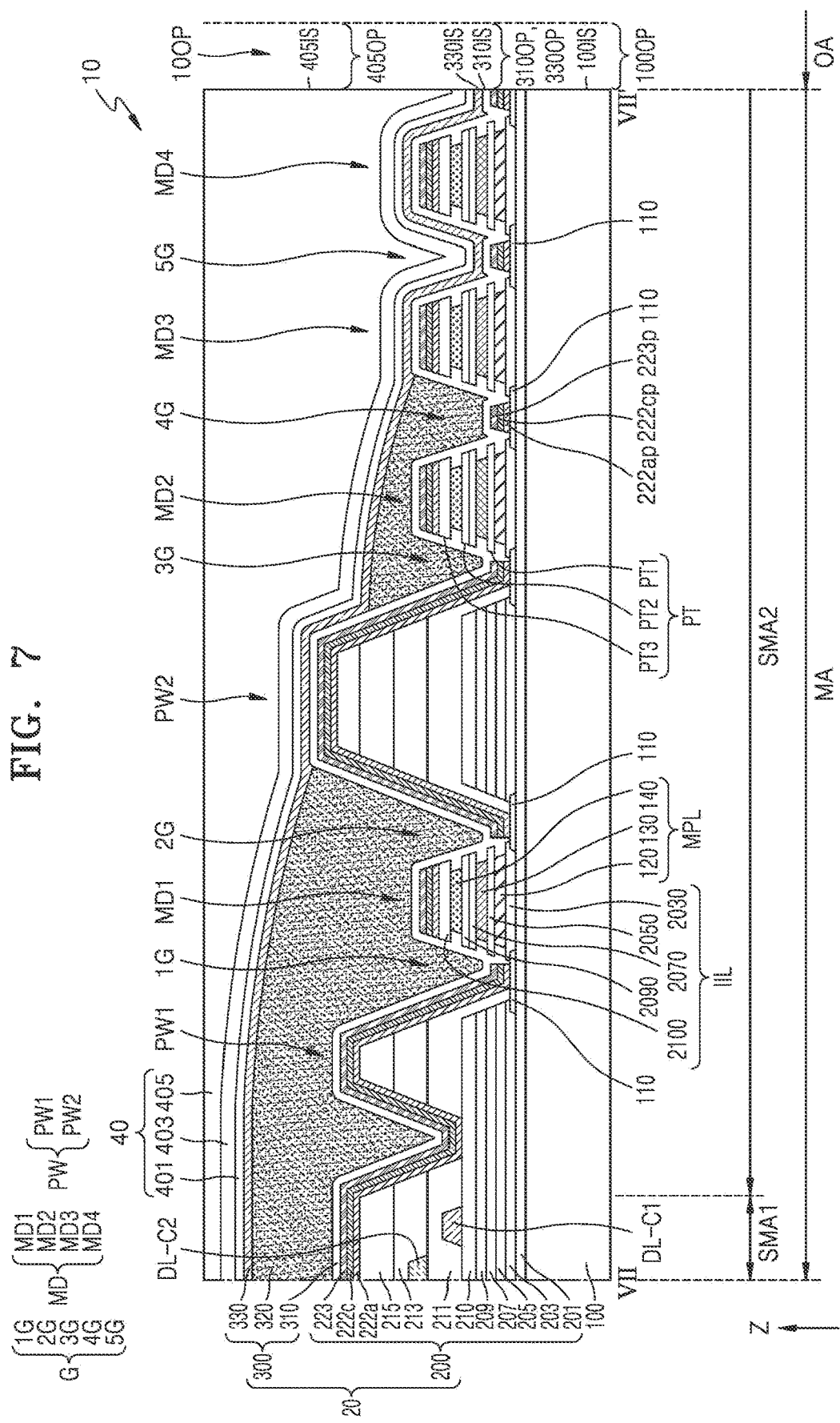
FIG. 7 is a cross-sectional view of a display panel taken along the line VII-VII' of FIG. 5, according to an embodiment.

FIG. 7 is a cross-sectional view of a display panel taken along the line VII-VII' of FIG. 5, according to an embodiment.

Referring to FIGS. 6 and 7, the intermediate area MA may include the first sub-intermediate area SMA1 adjacent to the display area DA (e.g., see FIG. 6), and a second sub-intermediate area SM2 adjacent to the opening area OA. The bypass portions DL-C1 and DL-C2 of the data lines DL described above with reference to FIG. 6 may be arranged at (e.g., in or on) the first sub-intermediate area SMA1, and the bypass portions DL-C1 and DL-C2 of the data lines DL illustrated in the first sub-intermediate area SMA1 of FIG. 7 may correspond to the bypass portions of some of the data lines DL from among the data lines DL described above with reference to FIG. 6.

Separators MD, partition walls PW, and grooves G may be arranged at (e.g., in or on) the second sub-intermediate area SMA2. The encapsulation layer 300 may extend to the intermediate area MA to cover the separators MD, the partition walls PW, and the grooves G.

The partition walls PW may include a first partition wall PW1 and a second partition wall PW2. However, the present disclosure is not limited thereto. In other embodiments, one, three, or four or more partition walls PW may be located over the intermediate area MA. The first partition wall PW1 may be arranged between the display area DA and the opening area OA, and the second partition wall PW2 may be arranged between the first partition wall PW1 and the opening area OA. The first partition wall PW1 and the second partition wall PW2 may be arranged along the periphery of the opening area OA.

The separators MD may include a first separator MD1, a second separator MD2, a third separator MD3, and a fourth separator MD4 that are arranged to be spaced apart from each other. However, the present disclosure is not limited thereto. Four or more separators MD may be provided over the intermediate area MA, and for example, ten separators MD may be arranged at (e.g., in or on) the intermediate area MA. Each of the first to fourth separators MD1, MD2, MD3, and MD4 may be arranged along the periphery of the opening area OA, and may have a closed-loop shape surrounding (e.g., around the periphery of) the opening area OA in the plan view.

The separator MD may have a structure in which a plurality of inorganic pattern layers IIL and a plurality of metal pattern layers MPL are alternately stacked on one another. The separator MD may have a structure in which at least three or more inorganic pattern layers IIL and at least three or more metal pattern layers MPL are alternately stacked on one another. The inorganic pattern layer IIL may include a first inorganic pattern layer 2030, a second inorganic pattern layer 2050, a third inorganic pattern layer 2070, a fourth inorganic pattern layer 2090, and a fifth inorganic pattern layer 2100. The metal pattern layer MPL may include a first metal pattern layer 120, a second metal pattern layer 130, and a third metal pattern layer 140. The plurality of inorganic pattern layers IIL and the plurality of metal pattern layers MPL may be arranged to overlap with each other.

The separator MD may have, for example, a structure in which the first inorganic pattern layer 2030, the first metal pattern layer 120, the second inorganic pattern layer 2050, the second metal pattern layer 130, the third inorganic pattern layer 2070, the fourth inorganic pattern layer 2090, the third metal pattern layer 140, and the fifth inorganic pattern layer 2100 are sequentially stacked on one another.

The first to fifth inorganic pattern layers 2030, 2050, 2070, 2090, and 2100 may be located at (e.g., in or on) the same layer and may include the same material as those of the inorganic insulating layers included in the subpixel circuit unit described above with reference to FIG. 6. For example, the first inorganic pattern layer 2030 may be arranged at (e.g., in or on) the same layer and may include the same material as those of the first gate insulating layer 203. The second inorganic pattern layer 2050 may be located at (e.g., in or on) the same layer and may include the same material as those of the second gate insulating layer 205. The third inorganic pattern layer 2070 may be located at (e.g., in or on) the same layer and may include the same material as those of the first interlayer insulating layer 207. The fourth inorganic pattern layer 2090 may be located at (e.g., in or on) the same layer and may include the same material as those of the third gate insulating layer 209. The fifth inorganic pattern layer 2100 may be located at (e.g., in or on) the same layer and may include the same material as those of the second interlayer insulating layer 210.

The first to third metal pattern layers 120, 130, and 140 may be located at (e.g., in or on) the same layer and may include the same material as those of the electrodes of the storage capacitor and the transistors included in the subpixel circuit PC described above with reference to FIG. 6. For example, the first metal pattern layer 120 may be located at (e.g., in or on) the same layer and may include the same material as those of the first gate electrode GE1 of the first thin film transistor TFT1 and/or the first capacitor electrode CE1 of the storage capacitor Cst. The second metal pattern layer 130 may be located at (e.g., in or on) the same layer and may include the same material as those of the second capacitor electrode CE2 of the storage capacitor Cst and/or the bottom gate electrode BGE. The third metal pattern layer 140 may be located at (e.g., in or on) the same layer and may include the same material as those of the second gate electrode GE2 of the second thin film transistor TFT2.

In an embodiment, the width of the second inorganic pattern layer 2050 located over the first metal pattern layer 120 may be greater than the width of the first metal pattern layer 120. The width of each of the third inorganic pattern layer 2070 and the fourth inorganic pattern layer 2090 located between the second metal pattern layer 130 and the third metal pattern layer 140 may be greater than the width of each of the second metal pattern layer 130 and the third metal pattern layer 140. Also, the width of the fifth inorganic pattern layer 2100 located over the third metal pattern layer 140 may be greater than the width of the third metal pattern layer 140.

In an embodiment, the grooves G may be provided between the partition walls PW and the separators MD. In this regard, FIG. 7 illustrates that first to fifth grooves 1G, 2G, 3G, 4G, and 5G are arranged at (e.g., in or on) the intermediate area MA. As described above with reference to FIG. 5, the first to fifth grooves 1G, 2G, 3G, 4G, and 5G may have a closed-loop shape surrounding (e.g., around a periphery of) the opening area OA in the plan view.

In more detail, the first groove 1G may be defined between the first partition wall PW1 and the first separator MD1. The second groove 2G may be defined between the first separator MD1 and the second partition wall PW2. The third groove 3G may be defined between the second partition wall PW2 and the second separator MD2. The fourth groove 4G may be defined between the second separator MD2 and the third separator MD3. The fifth groove 5G may be defined between the third separator MD3 and the fourth separator MD4.

The groove G may pass through (e.g., may penetrate) at least one inorganic insulating layer formed over the buffer layer 201. The at least one inorganic insulating layer having the groove G formed therein may include one or more of the inorganic insulating layers included in the subpixel circuit unit. In this regard, FIG. 7 illustrates that the first to fifth grooves 1G, 2G, 3G, 4G, and 5G are formed through (e.g., penetrate) the first gate insulating layer 203, the second gate insulating layer 205, the first interlayer insulating layer 207, the third gate insulating layer 209, and the second interlayer insulating layer 210.

A lower layer 110 may be located under (e.g., directly under) the groove G. The lower layer 110 may function as an etch stopper in an etching process for forming the groove G. Thus, a bottom surface of the groove G may be the upper surface of the lower layer 110. In this regard, FIG. 7 illustrates that the lower layer 110 is located under each of the first to fifth grooves 1G, 2G, 3G, 4G, and 5G, and the bottom surface of each of the first to fifth grooves 1G, 2G, 3G, 4G, and 5G is on the same plane as that of the upper surface of the lower layer 110.

The lower layer 110 may be located over the buffer layer 201, and may be formed in the same or substantially the same process as that of the first semiconductor layer Act1 described above with reference to FIG. 6. The lower layer 110 may include the same material (e.g., the silicon semiconductor material) as that of the first semiconductor layer Act1. Like the groove G, the lower layer 110 may have a closed-loop shape surrounding (e.g., around a periphery of) the opening area OA in a plan view.

When the groove G is formed over at least one inorganic insulating layer, moisture introduced through the substrate 100 may be blocked by the at least one inorganic insulating layer. FIG. 7 illustrates a structure in which the groove G is formed over the buffer layer 201, and the buffer layer 201 effectively blocks moisture that may be introduced through the substrate 100.

The separator MD may be arranged on at least one side of the groove G. For example, the second separator MD2 and the third separator MD3 may be arranged on opposite sides of the fourth groove 4G. From among the inorganic pattern layers IIL included in the second separator MD2 and the third separator MD3, a plurality of inorganic pattern layers IIL may include a tip PT extending toward the center of the fourth groove 4G. For example, at least three inorganic pattern layers IIL included in the second separator MD2 and the third separator MD3 may include the tip PT extending toward the center of the fourth groove 4G. In this regard, FIG. 7 illustrates that end portions of the second inorganic pattern layer 2050, the third and fourth inorganic pattern layers 2070 and 2090, and the fifth inorganic pattern layer 2100 included in the second separator MD2 and the third separator MD3 include the tips PT extending toward the center of the fourth groove 4G.

In more detail, the second inorganic pattern layer 2050 may include a first tip PT1 extending toward the center of the fourth groove 4G. The third inorganic pattern layer 2070 and the fourth inorganic pattern layer 2090 may include a second tip PT2 integrally extending toward the center of the fourth groove 4G. The fifth inorganic pattern layer 2100 may include a third tip PT3 extending toward the center of the fourth groove 4G. Thus, at least three tips PT may be provided on each of opposite sides of the fourth groove 4G.

Likewise, the third separator MD3 and the fourth separator MD4 may be arranged on opposite sides of the fifth groove 5G, and at least three inorganic pattern layers IIL included in the third separator MD3 and the fourth separator MD4 may include a tip PT extending toward the center of the fifth groove 5G. At least three tips PT may be provided on each of opposite sides of the fifth groove 5G.

The first separator MD1 may be arranged on one side of the first groove 1G, and/or on one side of the second groove 2G. At least three inorganic pattern layers IIL included in the first separator MD1 may include a tip PT extending toward the center of the first groove 1G. At least three tips PT may be provided on one side of the first groove 1G.

Likewise, the second separator MD2 may be arranged on one side of the third groove 3G, and at least three inorganic pattern layers IIL included in the second separator MD2 may include a tip PT extending toward the center of the third groove 3G. At least three tips PT may be provided on one side of the third groove 3G.

Some of the layers included in the organic light emitting diode OLED, for example, such as the first functional layer 222a and the second functional layer 222c, may be disconnected by the structure of the separator MD and the groove G.

In this regard, FIG. 7 illustrates that the first and second functional layers 222a and 222c and the opposite electrode 223 may be disconnected and separated by the first to fifth grooves 1G, 2G, 3G, 4G, and 5G and the first to fourth separators MD1, MD2, MD3, and MD4. Moisture may propagate toward the display area DA (e.g., see FIG. 6) through the side surface of the opening 100P of the display panel 10, and continuously formed organic material layers, for example, such as the first and second functional layers 222a and 222c, may be a propagation path of the moisture. However, as illustrated in FIG. 7, in some embodiments, because the first and second functional layers 222a and 222c are disconnected by the structure of the separator MD and the groove G, the moisture may be prevented or substantially prevented from propagating toward the display area DA.

The first inorganic encapsulation layer 310 of the encapsulation layer 300 may continuously cover the inner surface of the grooves G and the outer surface of the separators MD. The organic encapsulation layer 320 may cover the first sub-intermediate area SMA1, and may further cover a portion of the second sub-intermediate area SMA2. In an embodiment, the organic encapsulation layer 320 may cover at least one of (e.g., some of) the grooves G, for example, such as the first groove 1G and the second groove 2G arranged between the first partition wall PW1 and the second partition wall PW2. In other words, the organic encapsulation layer 320 may cover at least one of (e.g., some of) the separators MD, for example, such as the first separator MD1 arranged between the first partition wall PW1 and the second partition wall PW2. The second inorganic encapsulation layer 330 may entirely cover the intermediate area MA over the organic encapsulation layer 320.

The flow of monomers may be controlled by the partition wall PW and the separator MD, when the organic encapsulation layer 320 is formed. In an embodiment, at (e.g., in or on) the intermediate area MA, the organic encapsulation layer 320 may be discontinuously formed by the separator MD and the partition wall PW and/or the like. For example, as illustrated in FIGS. 6 and 7, at (e.g., in or on) the display area DA, a portion of the organic encapsulation layer 320 may cover an area up to the second partition wall PW2 through the first sub-intermediate area SMA1 and the first partition wall PW1, and another portion of the organic encapsulation layer 320 may cover a partial area between the second partition wall PW2 and the opening area OA. A portion of the second inorganic encapsulation layer 330 may directly contact a portion of the first inorganic encapsulation layer 310 over the second partition wall PW2, which may define (e.g., may be) a discontinuous area (e.g., a discontinuous point) of the organic encapsulation layer 320.

In an embodiment, an end portion of the organic encapsulation layer 320 may be located over or on one side of any suitable one of the separators MD that is located between the second partition wall PW2 and the opening area OA. In this regard, FIG. 7 illustrates that the end portion of the organic encapsulation layer 320 is located over or on one side of the third separator MD3, and does not extend toward the opening area OA through the third separator MD3. However, the present disclosure is not limited thereto.

In an embodiment, a portion of the second inorganic encapsulation layer 330 may directly contact a portion of the first inorganic encapsulation layer 310 on the upper surface of the second partition wall PW2. In an embodiment, the second inorganic encapsulation layer 330 may also directly contact the first inorganic encapsulation layer 310 between the third separator MD3 and the opening area OA.

The touch insulating layers described above with reference to FIG. 6 may extend to the intermediate area MA. In this regard, FIG. 7 illustrates a structure in which the first to third touch insulating layers 401, 403, and 405 extend to the intermediate area MA.

The display panel 10 may include the opening 100P at (e.g., in or on) the opening area OA. The opening 100P of the display panel 10 may include openings of the components constituting the display panel 10. For example, the opening 100P of the display panel 10 may include an opening 1000P of the substrate 100, openings 3100P and 3300P of the first and second inorganic encapsulation layers 310 and 330, and an opening 4050P of the third touch insulating layer 405.

The openings of the components constituting the display panel 10 may be concurrently (e.g., simultaneously or substantially simultaneously) formed with each other. Thus, an inner surface 100IS of the substrate 100 defining the opening 1000P of the substrate 100, inner surfaces 310IS and 330IS of the first and second inorganic encapsulation layers 310 and 330 defining the openings 3100P and 3300P of the first and second inorganic encapsulation layers 310 and 330, and an inner surface 405IS of the third touch insulating layer 405 defining the opening 4050P of the third touch insulating layer 405 may be located at (e.g., in or on) the same vertical line as (e.g., may be coplanar with) each other.

FIGS. 8A through 8D are cross-sectional views illustrating processes of a manufacturing method of a display panel according to an embodiment. FIGS. 8A through 8D illustrate cross-sections of the intermediate area MA, for example, such as the second sub-intermediate area SMA2, and the opening area OA, according to the processes of the manufacturing method of the display panel.

Referring to FIG. 8A, first to fourth separators MD1, MD2, MD3, and MD4, first to fifth grooves 1G, 2G, 3G, 4G, and 5G, and first and second partition walls PW1 and PW2 may be formed at (e.g., in or on) the intermediate area MA. The formation of the separators MD and the grooves G will be described in more detail below with reference to FIGS. 9A through 9D.

The first partition wall PW1 may be arranged between the display area DA and the first groove 1G. The second partition wall PW2 may be spaced apart from the first partition wall PW1, and may be arranged between the first partition wall PW1 and the opening area OA.

The first partition wall PW1 may include a portion 211 P1 of the first organic insulating layer 211, a portion 213P1 of the second organic insulating layer 213, and a portion 215P1 of the bank layer 215. The second partition wall PW2 may include a portion 211 P2 of the first organic insulating layer 211, a portion 213P2 of the second organic insulating layer 213, a portion 215P2 of the bank layer 215, and a portion 217P2 of the spacer 217 (e.g., see FIG. 6). In other embodiments, the first partition wall PW1 and the second partition wall PW2 may further include portions of some of the other layers, or some of the portions of the above described layers may be omitted as needed or desired.

Some of the inorganic insulating layers may be disposed under the first partition wall PW1 and the second partition wall PW2. For example, a portion 2031 of the first gate insulating layer 203, a portion 2051 of the second gate insulating layer 205, a portion 2071 of the first interlayer insulating layer 207, a portion 2091 of the third gate insulating layer 209, and a portion 2101 of the second interlayer insulating layer 210 may be disposed under the second partition wall PW2.

In an embodiment, the portion 211 P1 of the first organic insulating layer 211 of the first partition wall PW1 may be arranged to cover a portion of the inner surface of the first groove 1G formed in the inorganic insulating layers. Also, the portion 211 P2 of the first organic insulating layer 211 of the second partition wall PW2 may be arranged to cover a portion of the inner surface of the second groove 2G and the third groove 3G formed in the inorganic insulating layers.

A height H2 of the second partition wall PW2 may be equal to or greater than a height H1 of the first partition wall PW1. FIG. 7 illustrates that the height H2 of the second partition wall PW2 is greater than the height H1 of the first partition wall PW1. Because the first partition wall PW1 and the second partition wall PW2 include a portion of the organic insulating layers that is relatively thicker, whereas the separators MD include the inorganic pattern layers IIL and the metal pattern layers MPL, a height h of the separators MD may be less than the height H1 of the first partition wall PW1 and the height H2 of the second partition wall PW2.

Here, the heights of the partition wall and the separator may refer to a vertical distance from the upper surface of the substrate 100 to the upper surface of the corresponding partition wall or the corresponding separator.

Figure 8B:
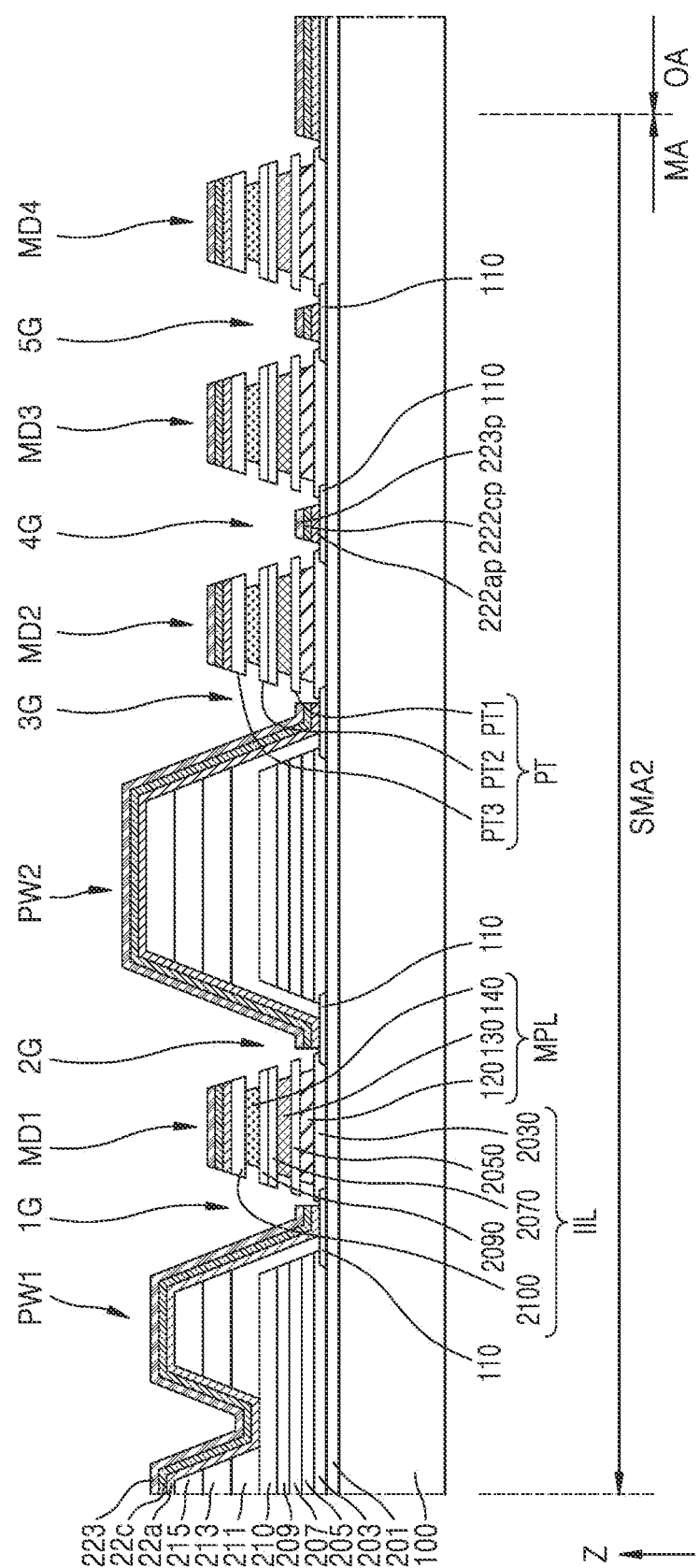

Referring to FIG. 8B, the first and second functional layers 222a and 222c and the opposite electrode 223 of an organic light emitting diode may be formed over the substrate 100 where the partition walls PW, the separators MD, and the grooves G are formed. The first and second functional layers 222a and 222c and the opposite electrode 223 may be formed through thermal deposition. As described above with reference to FIG. 7, each of the first and second functional layers 222a and 222c and the opposite electrode 223 may also be deposited at (e.g., in or on) the intermediate area MA. However, each of the first and second functional layers 222a and 222c and the opposite electrode 223 may be disconnected by the tips PT of the first to fourth separators MD1, MD2, MD3, and MD4 and the first to fifth grooves 1G, 2G, 3G, 4G, and 5G formed at (e.g., in or on) the intermediate area MA.

For example, FIG. 8B illustrates that the first functional layer 222a located over the tip PT is disconnected and separated, and a portion 222ap of the first functional layer 222a is arranged on the bottom surface of each of the fourth groove 4G and the fifth groove 5G. Similarly, FIG. 8B illustrates that the second functional layer 222c located over the tip PT is disconnected and separated, and a portion 222cp of the second functional layer 222c and a portion 223p of the opposite electrode 223 are arranged on the bottom surface of each of the fourth groove 4G and the fifth groove 5G.

Figure 8C:
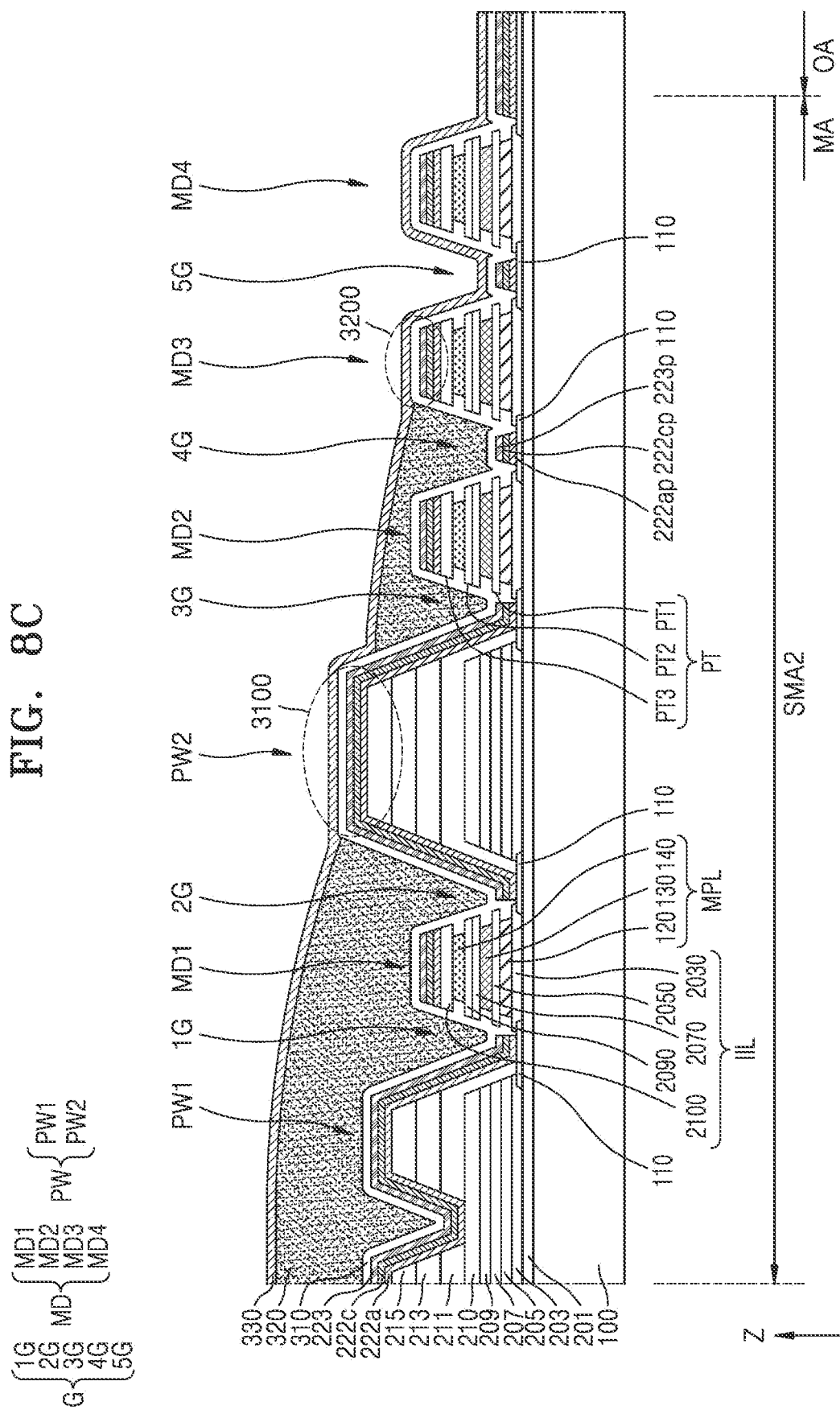

Referring to FIG. 8C, the encapsulation layer 300 may be formed. The first inorganic encapsulation layer 310 may be formed through chemical vapor deposition. Because the step coverage of the first inorganic encapsulation layer 310 may be suitable (e.g., may be relatively excellent), the first inorganic encapsulation layer 310 may continuously cover the inner surfaces of the first to fifth grooves 1G, 2G, 3G, 4G, and 5G, and may also continuously cover the lower surfaces of the tips PT of the first to fourth separators MD1, MD2, MD3, and MD4. The first inorganic encapsulation layer 310 may also continuously cover the side surfaces and the upper surface of the first partition wall PW1, and may also continuously cover the side surfaces and the upper surface of the second partition wall PW2.

Thereafter, the organic encapsulation layer 320 may be formed by applying and then curing monomers. The monomers may be applied by an inkjet method. The monomers may be suitably applied, such that some of the monomers may be present in an area between the display area DA and the first partition wall PW1, or in an area between the first partition wall PW1 and the second partition wall PW2. The first separator MD1 arranged between the first partition wall PW1 and the second partition wall PW2 may function to control the flow of the monomers.

In an embodiment, when the amount of the monomers exceeds a limit (e.g., a threshold) that may be accommodated in the area, a portion thereof may move beyond the second partition wall PW2. A portion of the second inorganic encapsulation layer 330 that is formed after the organic encapsulation layer 320 may directly contact a portion of the first inorganic encapsulation layer 310 over the second partition wall PW2. In this regard, FIG. 8C illustrates that an inorganic contact area (hereinafter, referred to as a first inorganic contact area) 3100, in which a portion of the second inorganic encapsulation layer 330 and a portion of the first inorganic encapsulation layer 310 directly contact each other, is present at a portion of the upper surface of the second partition wall PW2.

The inorganic contact area formed by the direct contact between the second inorganic encapsulation layer 330 and the first inorganic encapsulation layer 310 may also be present over the separator MD arranged between the second partition wall PW2 and the opening area OA. For example, the organic encapsulation layer 320 may not extend toward the opening area OA through the third separator MD3, and on the side surface or the upper surface of the third separator MD3, a portion of the second inorganic encapsulation layer 330 may directly contact a portion of the first inorganic encapsulation layer 310 to form a second inorganic contact area 3200.

In an embodiment, a portion of the organic encapsulation layer 320 may be present in the first groove 1G, the second groove 2G, the third groove 3G, and the fourth groove 4G. On the other hand, the material corresponding to the organic encapsulation layer 320 may not be present in the fifth groove 5G that is closer to the opening area OA than the second partition wall PW2, and the second inorganic encapsulation layer 330 may directly contact the first inorganic encapsulation layer 310 on the inner surface of the fifth groove 5G. However, the present disclosure is not limited thereto.

Referring to FIG. 8D, a first touch insulating layer 401, a second touch insulating layer 403, and a third touch insulating layer 405 may be formed over the encapsulation layer 300. The first conductive layer 402 (e.g., see FIG. 6) may be formed between the first touch insulating layer 401 and the second touch insulating layer 403, and the second conductive layer 404 may be formed between the second touch insulating layer 403 and the third touch insulating layer 405.

Thereafter, the components located at (e.g., in or on) the opening area OA are removed along a cutting line CL by using a laser beam or the like, and the opening 100P of the display panel 10 may be formed in the opening area OA as illustrated in FIG. 7.

FIGS. 9A through 9D are cross-sectional views illustrating processes of forming a separator and a groove of a display panel according to an embodiment. The structure of the separator MD and the groove G illustrated in FIG. 7 may be formed through the processes illustrated in FIGS. 9A through 9D.

Figure 9A:
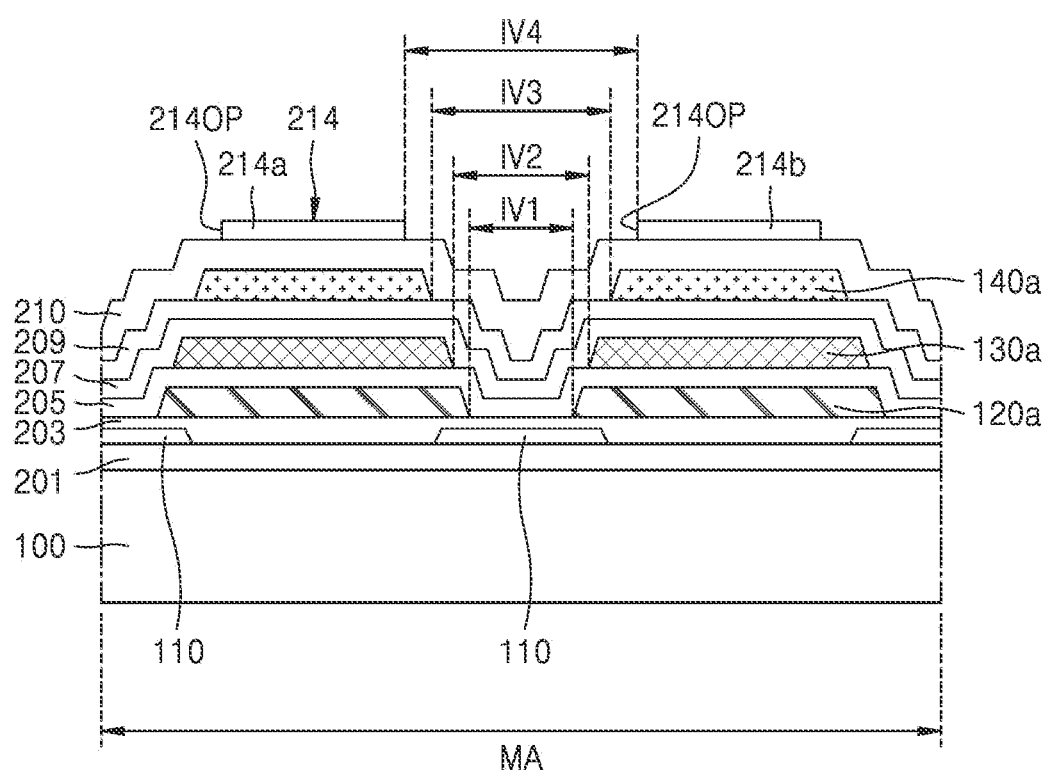
FIGS. 9A-9D are cross-sectional views illustrating processes of forming a separator and a groove of a display panel according to an embodiment.

Referring to FIG. 9A, inorganic insulating layers may be formed over the substrate 100. The inorganic insulating layers may sequentially include a buffer layer 201, a first gate insulating layer 203, a second gate insulating layer 205, a first interlayer insulating layer 207, a third gate insulating layer 209, and a second interlayer insulating layer 210.

A first preliminary metal layer 120a, a second preliminary metal layer 130a, and a third preliminary metal layer 140a may be formed between the inorganic insulating layers. The first preliminary metal layer 120a, the second preliminary metal layer 130a, and the third preliminary metal layer 140a may be arranged to overlap with each other.

The first preliminary metal layer 120a may be formed to be arranged between the first gate insulating layer 203 and the second gate insulating layer 205, and may be formed in the same process as that of the first gate electrode GE1 of the first thin film transistor TFT1 and/or the first capacitor electrode CE1 of the storage capacitor Cst described above with reference to FIG. 6. The second preliminary metal layer 130a may be formed to be arranged between the second gate insulating layer 205 and the first interlayer insulating layer 207, and may be formed in the same process as that of the bottom electrode BGE and/or the second capacitor electrode CE2 of the storage capacitor Cst. The third preliminary metal layer 140a may be formed to be arranged between the third gate insulating layer 209 and the second interlayer insulating layer 210, and may be formed in the same process as that of the second gate electrode GE2 of the second thin film transistor TFT2.

The first preliminary metal layer 120a may be spaced apart from an adjacent first preliminary metal layer 120a. The second preliminary metal layer 130a may be spaced apart from an adjacent second preliminary metal layer 130a. The third preliminary metal layer 140a may be spaced apart from an adjacent third preliminary metal layer 140a.

For example, the first preliminary metal layer 120a may be spaced apart from the adjacent first preliminary metal layer 120a, with the lower layer 110 therebetween. In other words, two adjacent first preliminary metal layers 120a may be arranged on opposite sides, respectively, of the lower layer 110. The two adjacent first preliminary metal layers 120a may be spaced apart from each other by a first interval IV1. The first interval IV1 may correspond to a spacing distance (e.g., a spacing distance in the horizontal direction) between end portions of the two adjacent first preliminary metal layers 120a.

The second preliminary metal layer 130a may be spaced apart from the adjacent second preliminary metal layer 130a, with the lower layer 110 therebetween. In other words, two adjacent second preliminary metal layers 130a may be arranged on opposite sides, respectively, of the lower layer 110. The two adjacent second preliminary metal layers 130a may be spaced apart from each other by a second interval IV2.

The third preliminary metal layer 140a may be spaced apart from the adjacent third preliminary metal layer 140a, with the lower layer 110 therebetween. In other words, two adjacent third preliminary metal layers 140a may be arranged on opposite sides, respectively, of the lower layer 110. The two adjacent third preliminary metal layers 140a may be spaced apart from each other by a third interval IV3.

The lower layer 110 may be formed over the buffer layer 201. The lower layer 110 may be formed in the same process as that of the first semiconductor layer Act1 described above with reference to FIG. 6.

A mask layer 214 may be formed over the second interlayer insulating layer 210. The mask layer 214 may include a first portion 214a and a second portion 214b spaced apart from each other, with an opening 2140P therebetween. The first portion 214a of the mask layer 214 may be arranged to overlap with any one of the two adjacent preliminary metal layers, and the second portion 214b may be arranged to overlap with the other one of the two adjacent preliminary metal layers.

The first portion 214a and the second portion 214b of the mask layer 214 may be spaced apart from each other by a fourth interval IV4. The fourth interval IV4 of the mask layer 214, or in other words, a width of the opening 2140P of the mask layer 214, may be equal to or greater than the first interval IV1 between the first preliminary metal layers 120a, the second interval IV2 between the second preliminary metal layers 130a, and the third interval IV3 between the third preliminary metal layers 140a. In an embodiment, the third interval IV3 may be equal to or greater than the second interval IV2, and/or the second interval IV2 may be equal to or greater than the first interval IV1. For example, as illustrated in FIG. 9A, the fourth interval IV4 may be greater than the third interval IV3, the third interval IV3 may be greater than the second interval IV2, and the second interval IV2 may be greater than the first interval IV1.

Thereafter, the inorganic insulating layers under the mask layer 214 may be partially removed. For example, the first gate insulating layer 203, the second gate insulating layer 205, the first interlayer insulating layer 207, the third gate insulating layer 209, and the second interlayer insulating layer 210 under the mask layer 214 may be partially removed.

The inorganic insulating layers may be removed by an etching process, for example, such as a dry etching process. In an embodiment, as described above with reference to FIG. 6, the etching may be concurrently (e.g., simultaneously or substantially simultaneously) performed in the process of forming the first contact hole CT1 in the inorganic insulating layers for connection of the first source electrode SE1 and the first drain electrode DE1 to the first semiconductor layer Act.

The lower layer 110 may function as an etch stopper in the etching process of partially removing the first gate insulating layer 203, the second gate insulating layer 205, the first interlayer insulating layer 207, the third gate insulating layer 209, and the second interlayer insulating layer 210.

Figure 9B:
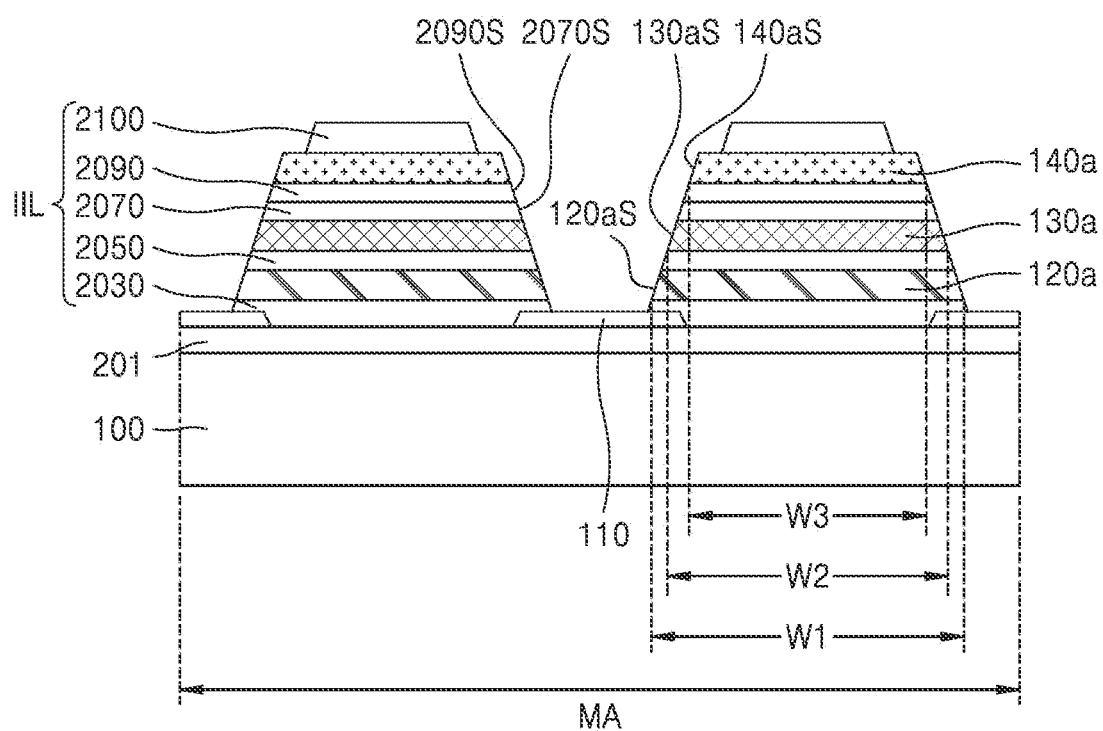

Referring to FIG. 9B, in the etching process, the inorganic insulating layers exposed by the opening 2140P of the mask layer 214 may be removed in the thickness direction. A portion of the second interlayer insulating layer 210 protected by the first portion 214a and the second portion 214b of the mask layer 214 may remain unetched. Accordingly, a fifth inorganic pattern layer 2100 may be formed.

In the etching process, each of the first preliminary metal layer 120a, the second preliminary metal layer 130a, and the third preliminary metal layer 140a may also function as a mask. Accordingly, a portion of the third gate insulating layer 209 and the first interlayer insulating layer 207 located directly under the third preliminary metal layer 140a, a portion of the second gate insulating layer 205 located directly under the second preliminary metal layer 130a, and a portion of the first gate insulating layer 203 located directly under the first preliminary metal layer 120a may not be etched. Accordingly, a fourth inorganic pattern layer 2090, a third inorganic pattern layer 2070, a second inorganic pattern layer 2050, and a first inorganic pattern layer 2030 may be formed.

A side surface 2090S of the fourth inorganic pattern layer 2090 and a side surface 2070S of the third inorganic pattern layer 2070 may be located on the same or substantially the same plane as each other. The expression, the side surface 2090S of the fourth inorganic pattern layer 2090 and the side surface 2070S of the third inorganic pattern layer 2070 are located on the same or substantially on the same plane as each other, may represent that the side surface 2090S of the fourth inorganic pattern layer 2090 and the side surface 2070S of the third inorganic pattern layer 2070 do not form a step therebetween.

In the etching process, an end portion (e.g., a side surface) 120aS of the first preliminary metal layer 120a, an end portion (e.g., a side surface) 130aS of the second preliminary metal layer 130a, and an end portion (e.g., a side surface) 140as of the third preliminary metal layer 140a may be exposed by not being covered by the insulating layers.

Figure 9C:
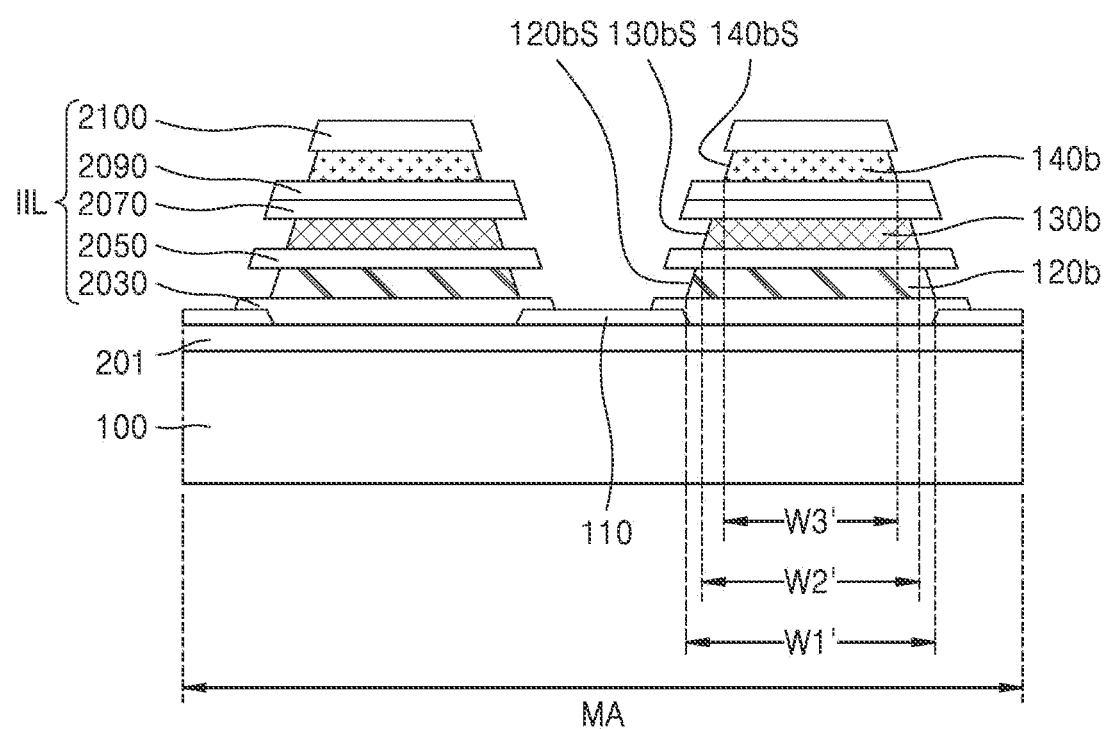

Referring to FIG. 9C, a portion of the first to third preliminary metal layers 120a, 130a, and 140a may be removed. The process of removing the portion of the first to third preliminary metal layers 120a, 130a, and 140a may be performed by an etching process, for example, such as a wet etching process. In an embodiment, as described above with reference to FIG. 6, the etching may be concurrently (e.g., simultaneously or substantially simultaneously) performed in an etching process for removing impurities before forming the first source electrode SE1 and the first drain electrode DE1 after forming the first contact hole CT1 (e.g., see FIG. 6) in the inorganic insulating layers for connection of the first source electrode SE1 and the first drain electrode DE1 to the first semiconductor layer Act.

In the etching process of removing the portion of the first to third preliminary metal layers 120a, 130a, and 140a, an etchant having a high etch selectivity for the first to third preliminary metal layers 120a, 130a, and 140a, and a low etch selectivity for the first semiconductor layer Act may be used.

In the etching process, an exposed end portion (e.g., side surface) 120aS of the first preliminary metal layer 120a may be partially removed to form a first preliminary metal pattern layer 120b. An exposed end portion (e.g., side surface) 130aS of the second preliminary metal layer 130a may be partially removed to form a second preliminary metal pattern layer 130b. An exposed end portion (e.g., side surface) 140aS of the third preliminary metal layer 140a may be partially removed to form a third preliminary metal pattern layer 140b.

A width W1' of the first preliminary metal pattern layer 120b may be less than a width W1 of the first preliminary metal layer 120a. A width W2' of the second preliminary metal pattern layer 130b may be less than a width W2 of the second preliminary metal layer 130a. A width W3' of the third preliminary metal pattern layer 140b may be less than a width W3 of the third preliminary metal layer 140a.

The first to third preliminary metal pattern layers 120b, 130b, and 140b may have an undercut structure with respect to the inorganic pattern layers respectively disposed thereover.

An end portion (e.g., a side surface) 120bS of the first preliminary metal pattern layer 120b, an end portion (e.g., a side surface) 130bS of the second preliminary metal pattern layer 130b, and an end portion (e.g., a side surface) 140bs of the third preliminary metal pattern layer 140b may be exposed by not being covered by the insulating layers.

Figure 9D:
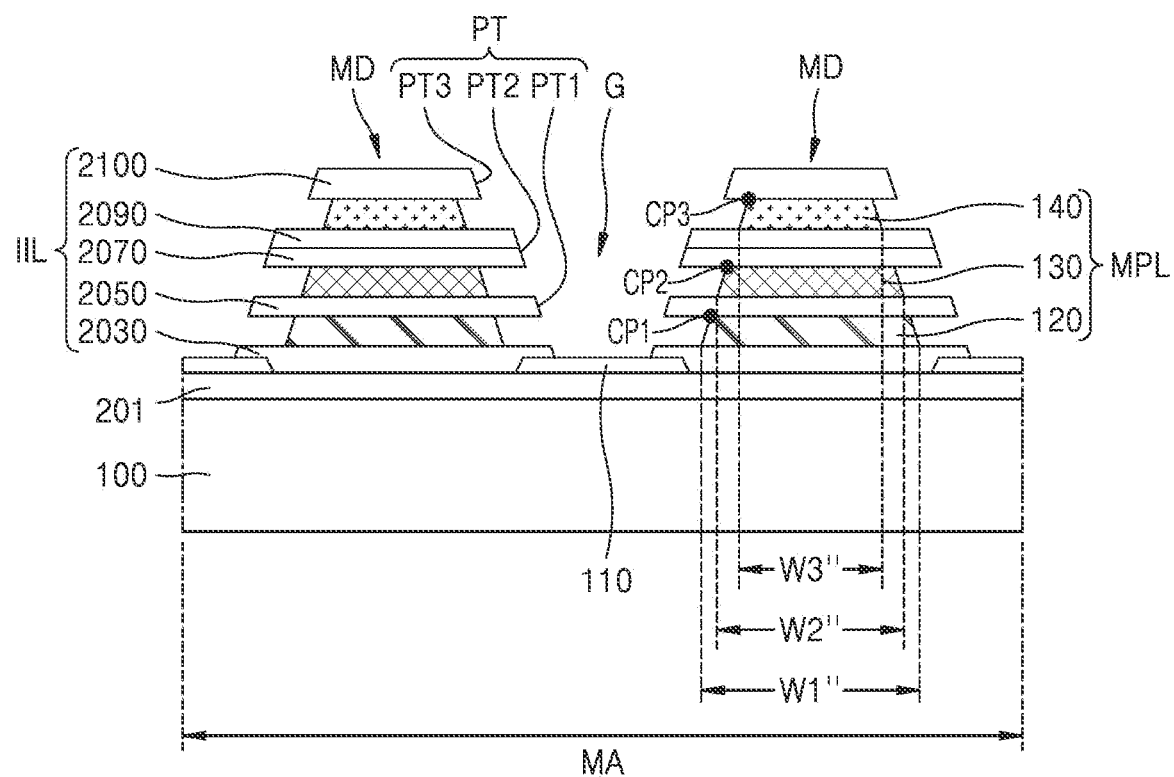

Referring to FIGS. 9C and 9D, a portion of the first to third preliminary metal pattern layers 120b, 130b, and 140b may be removed. The process of removing the portion of the first to third preliminary metal pattern layers 120b, 130b, and 140b may be performed by an etching process, for example, such as a dry or wet etching process. In an embodiment, as described above with reference to FIG. 6, the etching process may be concurrently (e.g., simultaneously or substantially simultaneously) performed in the process of forming the subpixel electrode 221 of the organic light emitting diode OLED (e.g., see FIG. 6) over the second organic insulating layer 213. The subpixel electrode 221 may be formed by forming a conductive layer, and then patterning the conductive layer.

In the etching process, an exposed end portion (e.g., side surface) 120bS of the first preliminary metal pattern layer 120b may be partially removed to form a first metal pattern layer 120. An exposed end portion (e.g., side surface) 130bS of the second preliminary metal pattern layer 130b may be partially removed to form a second metal pattern layer 130. An exposed end portion (e.g., side surface) 140bS of the fourth preliminary metal pattern layer 140b may be partially removed to form a third metal pattern layer 140.

A width W1" of the first metal pattern layer 120 may be less than the width W1' of the first preliminary metal pattern layer 120b. A width W2" of the second metal pattern layer 130 may be less than the width W2' of the second preliminary metal pattern layer 130b. A width W3" of the third metal pattern layer 140 may be less than the width W3' of the third preliminary metal pattern layer 140b.

Through the processes illustrated in FIGS. 9A through 9D, a separator MD including a plurality of metal pattern layers MPL and a plurality of inorganic pattern layers IIL, and a groove G between a plurality of separators MD may be formed. For example, the separator MD may have a structure in which the first inorganic pattern layer 2030, the first metal pattern layer 120, the second inorganic pattern layer 2050, the second metal pattern layer 130, the third inorganic pattern layer 2070, the fourth inorganic pattern layer 2090, and the third metal pattern layer 140 are sequentially stacked on one another.

The first to third metal pattern layers 120, 130, and 140 of the separator MD may have an undercut structure with respect to the inorganic pattern layers respectively disposed thereover. The end portions of the second to fifth inorganic pattern layers 2050, 2070, 2090, and 2100 may include tips PT extending toward the groove G. In other words, the respective end portions of the second to fifth inorganic pattern layers 2050, 2070, 2090, and 2100 may include tips PT protruding more in the lateral direction than the layers arranged directly under the respective layers. Here, the lateral direction may be a horizontal direction that is parallel to or substantially parallel to the upper surface of the substrate 100 (e.g., a direction perpendicular to or substantially perpendicular to the z axis), and may refer to a direction away from the center of each corresponding layer.

For example, the second inorganic pattern layer 2050 may include a first tip PT1 extending toward the center of the groove G from a first point CP1 where the side surface of the first metal pattern layer 120 and the lower surface of the second inorganic pattern layer 2050 meet each other. The third inorganic pattern layer 2070 and the fourth inorganic pattern layer 2090 may be integrally formed with each other, and may include a second tip PT2 extending toward the center of the groove G from a second point CP2 where the side surface of the second metal pattern layer 130 and the lower surface of the third inorganic pattern layer 2070 meet each other. The fifth inorganic pattern layer 2100 may include a third tip PT3 extending toward the center of the groove G from a third point CP3 where the side surface of the third metal pattern layer 140 and the lower surface of the fifth inorganic pattern layer 2100 meet each other.

In other words, the second inorganic pattern layer 2050 may include the first tip PT1 protruding laterally from the first point CP1 where the side surface of the first metal pattern layer 120 and the lower surface of the second inorganic pattern layer 2050 meet each other. The third inorganic pattern layer 2070 and the fourth inorganic pattern layer 2090 may be integrally formed with each other, and may include the second tip PT2 protruding laterally from the second point CP2 where the side surface of the second metal pattern layer 130 and the lower surface of the third inorganic pattern layer 2070 meet each other. The fifth inorganic pattern layer 2100 may include the third tip PT3 protruding laterally from the third point CP3 where the side surface of the third metal pattern layer 140 and the lower surface of the fifth inorganic pattern layer 2100 meet each other.

According to one or more embodiments described above, the structure of the tip PT and the groove G of the separator MD may be formed without adding a separate mask process, by using the process of forming the first contact hole CT1, the etching process of removing impurities before forming the first source electrode SE1 and the first drain electrode DE1 after forming the first contact hole CT1, and the process of forming the subpixel electrode 221. Also, because the separator MD does not include an organic insulating layer, and includes an inorganic pattern layer and a metal pattern layer having a relatively low thickness, the step of the separator MD may be decreased compared to a case of a separator including an organic insulating layer, and thus, the process of forming a planarization layer for compensating for the step between the groove G and the separator MD may be omitted. Thus, costs in the processes of manufacturing the display panel may be reduced.

According to one or more embodiments, because the separator MD includes at least three multiple tips PT on one side thereof, the first functional layer 222a, the second functional layer 222c, and the opposite electrode 223 may be effectively disconnected or separated, to minimize or reduce damage that may be caused to the organic light emitting diode OLED by moisture. Thus, reliability of the apparatus may be improved.

Figure 10A:
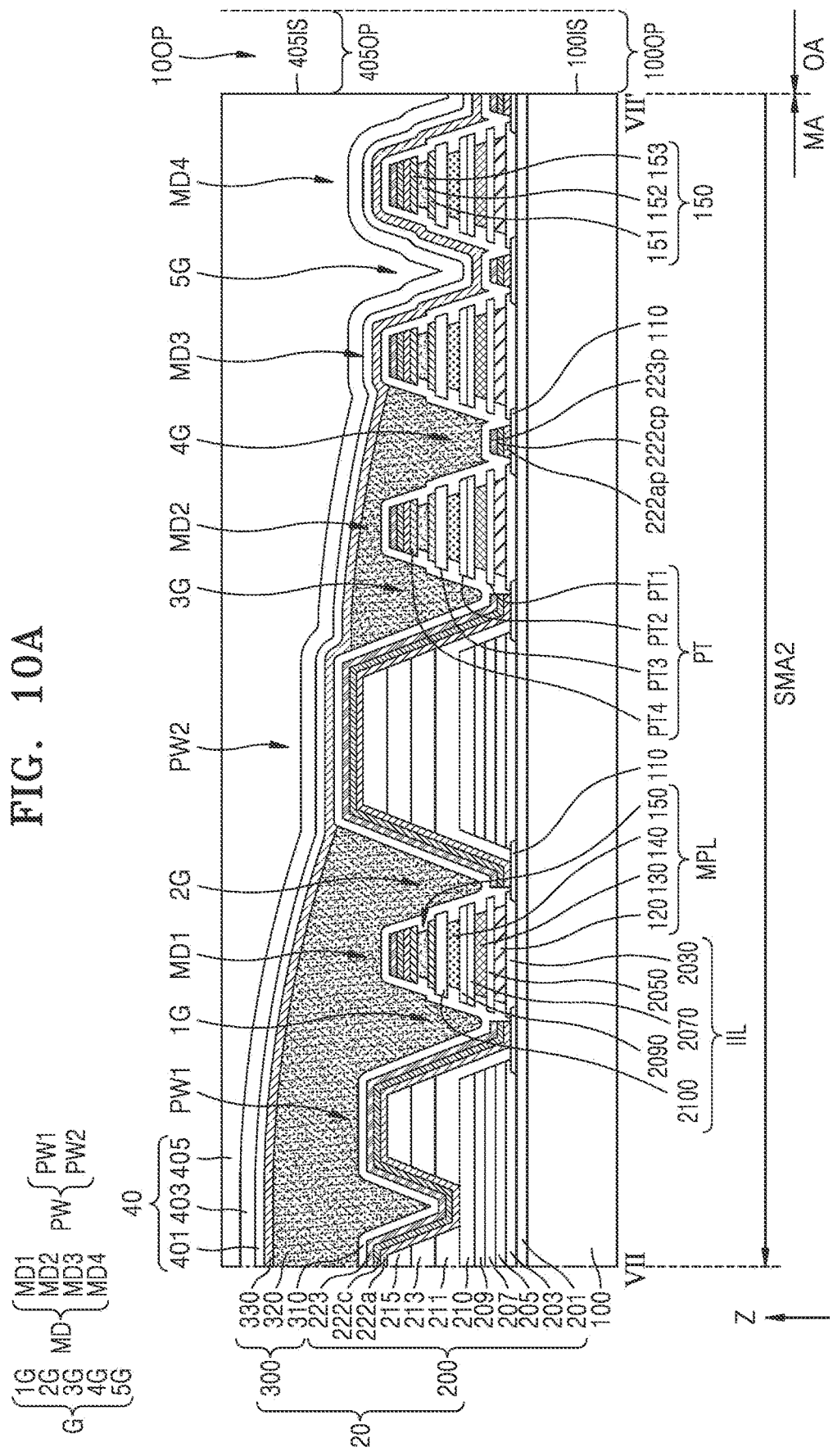
FIG. 10A is a cross-sectional view of a display panel according to an embodiment.
Figure 10B:
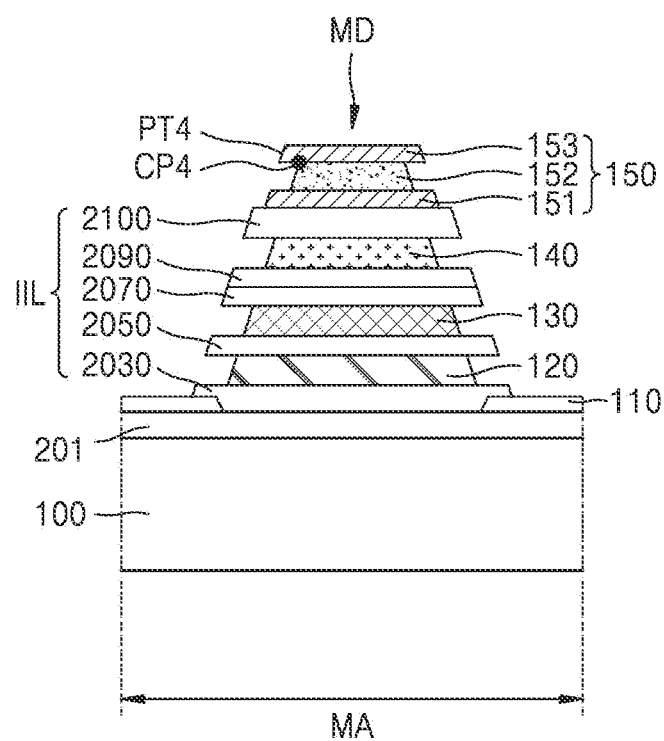
FIG. 10B is an enlarged cross-sectional view of one separator illustrated in FIG. 10A.

FIG. 10A is a cross-sectional view of a display panel according to an embodiment. FIG. 10B is an enlarged cross-sectional view of one separator illustrated in FIG. 10A. Referring to FIGS. 10A and 10B, the configuration of the separator MD may be different from that of the embodiments described above with reference to FIG. 7. Hereinafter, the differences of the separators MD therebetween will be mainly described, and redundant description thereof may not be repeated.

Referring to FIGS. 10A and 10B the separators MD, partition walls PW, and grooves G may be arranged at (e.g., in or on) the intermediate area MA, for example, such as at the second sub-intermediate area SM2. The encapsulation layer 300 may extend to the intermediate area MA to cover the separators MD, the partition walls PW, and the grooves G.

In an embodiment, the separators MD may include a first separator MD1, a second separator MD2, a third separator MD3, and a fourth separator MD4 that are arranged to be spaced apart from each other. However, the present disclosure is not limited thereto. Four or more separators MD may be provided over the intermediate area MA, and for example, ten separators MD may be arranged at (e.g., in or on) the intermediate area MA.

The separator MD may have a structure in which a plurality of inorganic pattern layers IIL and a plurality of metal pattern layers MPL are alternately stacked on one another. The separator MD may have a structure in which at least three or more inorganic pattern layers IIL and at least three or more metal pattern layers MPL are alternately stacked on one another. The inorganic pattern layer IIL may include a first inorganic pattern layer 2030, a second inorganic pattern layer 2050, a third inorganic pattern layer 2070, a fourth inorganic pattern layer 2090, and a fifth inorganic pattern layer 2100. The metal pattern layer MPL may include a first metal pattern layer 120, a second metal pattern layer 130, a third metal pattern layer 140, and a fourth metal pattern layer 150. The plurality of inorganic pattern layers IIL and the plurality of metal pattern layers MPL may be arranged to overlap with each other.

The separator MD may have, for example, a structure in which the first inorganic pattern layer 2030, the first metal pattern layer 120, the second inorganic pattern layer 2050, the second metal pattern layer 130, the third inorganic pattern layer 2070, the fourth inorganic pattern layer 2090, the third metal pattern layer 140, the fifth inorganic pattern layer 2100, and the fourth metal pattern layer 150 are sequentially stacked on one another.

In an embodiment, the fourth metal pattern layer 150 may include a first sublayer 151, a second sublayer 152, and a third sublayer 153 that are sequentially stacked on one another. The first sublayer 151 and the second sublayer 152 of the fourth metal pattern layer 150 may include the same material as each other. The second sublayer 152 may include a different material than that of the first sublayer 151 and the third sublayer 153.

The fourth metal pattern layer 150 may include the same material as that of the data line DL and/or the driving voltage line PL described above with reference to FIG. 6. For example, the first sublayer 151, the second sublayer 152, and the third sublayer 153 of the fourth metal pattern layer 150 may include the same material as those of the first layer PL1, the second layer PL2, and the third layer PL3 of the driving voltage line PL. For example, the first sublayer 151 and the third sublayer 153 may include titanium (Ti), and the second sublayer 152 may include aluminum (Al).

The width of the third sublayer 153 of the fourth metal pattern layer 150 may be greater than the width of the second sublayer 152. The third sublayer 153 of the fourth metal pattern layer 150 may include a fourth tip PT4 extending toward the groove G from a fourth point CP4 where the upper surface of the second sublayer 152 and the lower surface of the third sublayer 153 meet each other. In other words, the third sublayer 153 of the fourth metal pattern layer 150 may include the fourth tip PT4 protruding laterally from the fourth point CP4 where the upper surface of the second sublayer 152 and the lower surface of the third sublayer 153 meet each other.

According to the present embodiment, the separator MD may further include the fourth metal pattern layer 150, and thus, may include at least four multiple tips PT on one side thereof. Accordingly, the first functional layer 222a, the second functional layer 222c, and the opposite electrode 223 may be effectively disconnected or separated, and damage to the organic light emitting diode OLED by moisture may be further minimized or reduced. Thus, reliability of the apparatus may be further improved.

Figure 11A:
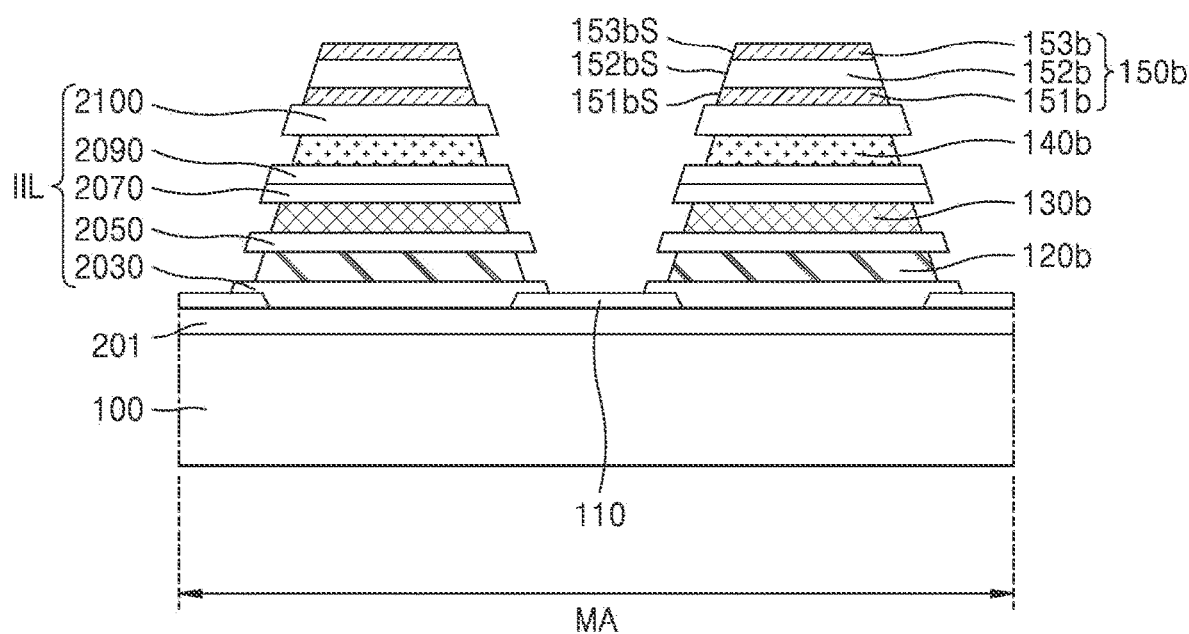
FIGS. 11A and 11B are cross-sectional views illustrating processes of forming a separator and a groove of a display panel according to an embodiment.
Figure 11B:
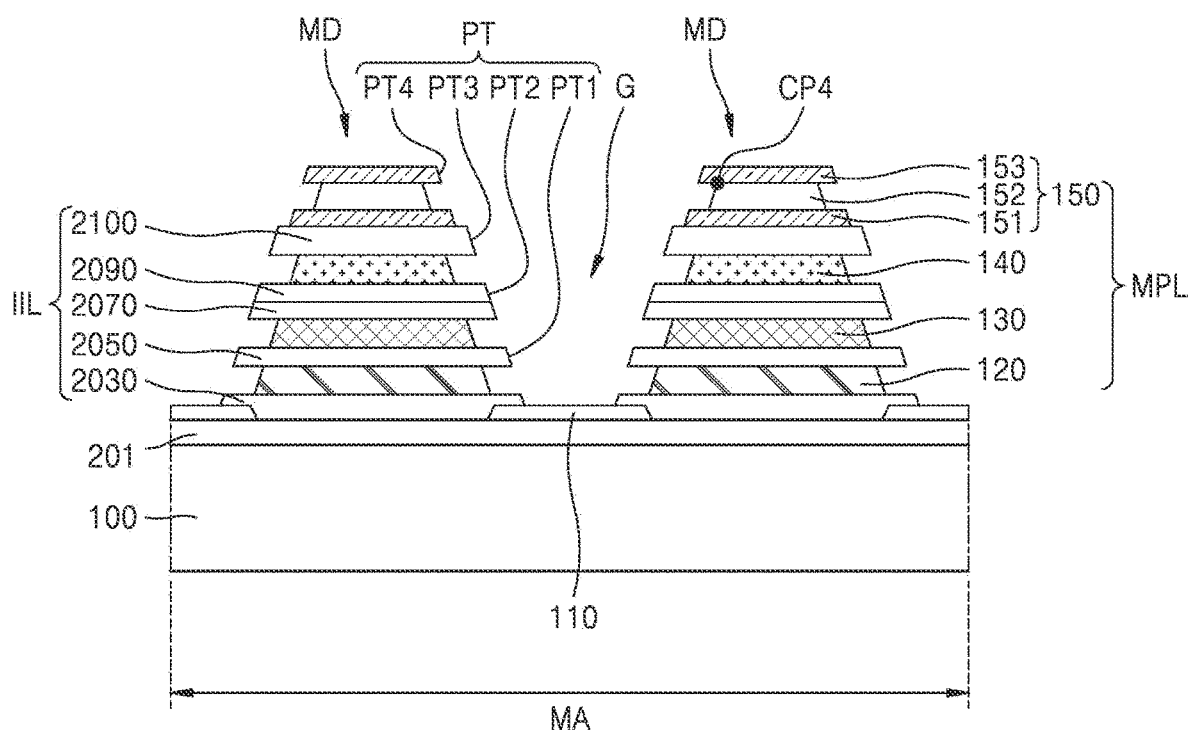

FIGS. 11A and 11B are cross-sectional views illustrating processes of forming a separator and a groove of a display panel according to an embodiment. The processes illustrated in FIGS. 11A and 11B may be applied to form the structure of the separator MD and the groove G illustrated in FIGS. 10A and 10B. In this case, the separator MD and the groove G illustrated in FIGS. 10A and 10B may be formed by performing the processes illustrated in FIGS. 11A and 11B after performing the processes illustrated in FIGS. 9A through 9C.

Referring to FIG. 11A, a fourth preliminary metal pattern layer 150b may be formed after the forming of the first to third preliminary metal pattern layers 120b, 130b, and 140b (e.g., see FIG. 9C) by removing the portion of the first to third preliminary metal layers 120a, 130a, and 140a.

The fourth preliminary metal pattern layer 150b may be formed over the fifth inorganic pattern layer 2100, and may be formed in the same process as that of the data line DL and/or the driving voltage line PL described above with reference to FIG. 6.

The fourth preliminary metal pattern layer 150b may be arranged to overlap with the first preliminary metal pattern layer 120b, the second preliminary metal pattern layer 130b, and the third preliminary metal pattern layer 140b.

An end portion (e.g., a side surface) 151bS of a first preliminary sublayer 151b, an end portion (e.g., a side surface) 152bS of a second preliminary sublayer 152b, and an end portion (e.g., a side surface) 153bS of a third preliminary sublayer 153b of the fourth preliminary metal pattern layer 150b may be exposed by not being covered by the insulating layers.

Referring to FIG. 11B, a portion of the fourth preliminary metal pattern layer 150b may be removed. For example, a portion of the first to third preliminary sublayers 151b, 152b, and 153b of the fourth preliminary metal pattern layer 150b may be removed. The process of removing the portion of the fourth preliminary metal pattern layer 150b may be performed by an etching process, for example, such as a wet etching process. In an embodiment, as described above with reference to FIG. 6, the etching process may be concurrently (e.g., simultaneously or substantially simultaneously) performed in the process of forming the subpixel electrode 221 of the organic light emitting diode OLED (e.g., see FIG. 6) over the second organic insulating layer 213.

In the etching process, a fourth metal pattern layer 150 may be formed by removing a portion of the fourth preliminary metal pattern layer 150b. For example, a first sublayer 151 may be formed by partially removing an exposed end portion (e.g., side surface) 151bS of the first preliminary sublayer 151b. A second sublayer 152 may be formed by partially removing an exposed end portion (e.g., side surface) 152bS of the second preliminary sublayer 152b. A third sublayer 153 may be formed by partially removing an exposed end portion (e.g., side surface) 153bS of the third preliminary sublayer 153b.

The second preliminary sublayer 152b may include a material having a different etch selectivity than that of the material of the first preliminary sublayer 151b and the third preliminary sublayer 153b. According to the etchant used in the etching process, the second preliminary sublayer 152b including, for example, aluminum (Al) may be overetched in comparison with the first preliminary sublayer 151b and the third preliminary sublayer 153b including, for example, titanium (Ti). Accordingly, a structure in which the third sublayer 153 of the fourth metal pattern layer 150 has a fourth tip PT4 may be formed.

In the etching process, as described above with reference to FIG. 9D, a portion of the first to third preliminary metal pattern layers 120b, 130b, and 140b may be removed, and a first metal pattern layer 120, a second metal pattern layer 130, and a third metal pattern layer 140 may be formed.

As described above, according to one or more embodiments of the present disclosure, productivity may be improved by reducing the number of process masks used to form the separator and the groove arranged around the opening area.

According to one or more embodiments of the present disclosure, damage that may be caused to the display element by external impurities, such as moisture, introduced from the opening area may be prevented or substantially prevented. However, the aspects and features of the present disclosure are not limited thereto.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:
   a substrate comprising:
      a first area;
      a second area surrounding at least a portion of the first area; and
      a third area between the first area and the second area;
   a light emitting diode at the second area, and comprising:
      a subpixel electrode;
      an opposite electrode; and
      an intermediate layer between the subpixel electrode and the opposite electrode;
   an encapsulation layer over the light emitting diode, and comprising:
      a first inorganic encapsulation layer;
      a second inorganic encapsulation layer; and
      an organic encapsulation layer between the first inorganic encapsulation layer and the second inorganic encapsulation layer;
   a first partition wall and a second partition wall located at the third area in a direction from the second area toward the first area;
   a first separator located between the second partition wall and the first area;
   a second separator located between the first separator and the first area; and
   a first groove defined between the first separator and the second separator,
   wherein each of the first separator and the second separator comprises:
      a first metal pattern layer over the substrate;
      a first inorganic pattern layer over the first metal pattern layer;
      a second metal pattern layer over the first inorganic pattern layer;
      a second inorganic pattern layer over the second metal pattern layer;
      a third metal pattern layer over the second inorganic pattern layer; and
      a third inorganic pattern layer over the third metal pattern layer, and
   wherein an end portion of each of the first, second, and third inorganic pattern layers comprises a tip extending toward a center of the first groove.

2. The display panel of claim 1, wherein the tip of the first inorganic pattern layer comprises a first tip extending toward the center of the first groove from a point where a side surface of the first metal pattern layer and a lower surface of the first inorganic pattern layer meet each other,
   wherein the tip of the second inorganic pattern layer comprises a second tip extending toward the center of the first groove from a point where a side surface of the second metal pattern layer and a lower surface of the second inorganic pattern layer meet each other, and
   wherein the tip of the third inorganic pattern layer comprises a third tip extending toward the center of the first groove from a point where a side surface of the third metal pattern layer and a lower surface of the third inorganic pattern layer meet each other.

3. The display panel of claim 1, wherein the first inorganic pattern layer has a greater width than that of the first metal pattern layer,
   the second inorganic pattern layer has a greater width than those of the second metal pattern layer and the third metal pattern layer, and
   the third inorganic pattern layer has a greater width than that of the third metal pattern layer.

4. The display panel of claim 1, further comprising a lower layer at the third area under the first groove,
   wherein an upper surface of the lower layer corresponds to a bottom surface of the first groove.

5. The display panel of claim 4, further comprising a subpixel circuit unit electrically connected to the light emitting diode, the subpixel circuit unit comprising:
   a first thin film transistor comprising a silicon-based semiconductor layer, and a first gate electrode at least partially overlapping with the silicon-based semiconductor layer;
   a second thin film transistor comprising an oxide-based semiconductor layer, and a second gate electrode at least partially overlapping with the oxide-based semiconductor layer;
   a capacitor electrode at least partially overlapping with the first gate electrode of the first thin film transistor; and
   a plurality of inorganic insulating layers over the silicon-based semiconductor layer, the oxide-based semiconductor layer, the first gate electrode, the second gate electrode, or the capacitor electrode.

6. The display panel of claim 5, wherein the lower layer comprises a same material as that of the silicon-based semiconductor layer.

7. The display panel of claim 5, wherein each of the first, second, and third metal pattern layers comprises a same material as that of any one of the first gate electrode, the second gate electrode, or the capacitor electrode, and
   wherein each of the first, second, and third inorganic pattern layers comprises a same material as that of any one of the plurality of inorganic insulating layers.

8. The display panel of claim 1, further comprising:
   a third separator between the first partition wall and the second partition wall; and
   a second groove defined between the first partition wall and the third separator, or between the third separator and the second partition wall,
   wherein at least a portion of the organic encapsulation layer fills the second groove.

9. The display panel of claim 1, wherein a first portion of the first inorganic encapsulation layer and a first portion of the second inorganic encapsulation layer directly contact each other on the second partition wall.

10. The display panel of claim 1, wherein a second portion of the first inorganic encapsulation layer and a second portion of the second inorganic encapsulation layer directly contact each other on the first separator or the second separator.

11. The display panel of claim 1, wherein each of the first separator and the second separator comprises a fourth metal pattern layer over the third inorganic pattern layer,
   wherein the fourth metal pattern layer comprises a first sublayer, a second sublayer, and a third sublayer that are sequentially stacked on one another, and
   wherein the third sublayer comprises a tip extending toward the center of the first groove from a point where a side surface of the second sublayer and a lower surface of the third sublayer meet each other.

12. The display panel of claim 11, wherein the first sublayer and the third sublayer comprise a same material as each other, and
wherein the second sublayer comprises a different material from that of the first sublayer and the third sublayer.

13. The display panel of claim 1, wherein the intermediate layer comprises at least one organic material layer, and
wherein the at least one organic material layer and the opposite electrode are disconnected or separated by the first separator and the second separator at the third area.

14. A display panel comprising:
a substrate comprising:
a first area;
a second area surrounding at least a portion of the first area; and
a third area between the first area and the second area;
a light emitting diode at the second area, and comprising:
a subpixel electrode;
an opposite electrode; and
an intermediate layer between the subpixel electrode and the opposite electrode;
an encapsulation layer over the light emitting diode, and comprising:
a first inorganic encapsulation layer;
a second inorganic encapsulation layer; and
an organic encapsulation layer between the first inorganic encapsulation layer and the second inorganic encapsulation layer;
a partition wall located at the third area; and
a first separator located between the partition wall and the first area,
wherein the first separator comprises:
a first metal pattern layer over the substrate;
a first inorganic pattern layer over the first metal pattern layer;
a second metal pattern layer over the first inorganic pattern layer;
a second inorganic pattern layer over the second metal pattern layer;
a third metal pattern layer over the second inorganic pattern layer; and
a third inorganic pattern layer over the third metal pattern layer, and
wherein an end portion of each of the first, second, and third inorganic pattern layers comprises a tip protruding more laterally than a corresponding layer located directly thereunder.

15. The display panel of claim 14, wherein the tip of the first inorganic pattern layer comprises a first tip protruding laterally from a point where a side surface of the first metal pattern layer and a lower surface of the first inorganic pattern layer meet each other,
wherein the tip of the second inorganic pattern layer comprises a second tip protruding laterally from a point where a side surface of the second metal pattern layer and a lower surface of the second inorganic pattern layer meet each other, and
wherein the tip of the third inorganic pattern layer comprises a third tip protruding laterally from a point where a side surface of the third metal pattern layer and a lower surface of the third inorganic pattern layer meet each other.

16. The display panel of claim 14, further comprising a subpixel circuit unit electrically connected to the light emitting diode, the subpixel circuit unit comprising:
a first thin film transistor comprising a silicon-based semiconductor layer, and a first gate electrode at least partially overlapping with the silicon-based semiconductor layer;
a second thin film transistor comprising an oxide-based semiconductor layer, and a second gate electrode at least partially overlapping with the oxide-based semiconductor layer;
a capacitor electrode at least partially overlapping with the first gate electrode of the first thin film transistor; and
a plurality of inorganic insulating layers over the silicon-based semiconductor layer, the oxide-based semiconductor layer, the first gate electrode, the second gate electrode, or the capacitor electrode.

17. The display panel of claim 16, wherein each of the first, second, and third metal pattern layers comprises a same material as that of any one of the first gate electrode, the second gate electrode, or the capacitor electrode, and
wherein each of the first, second, and third inorganic pattern layers comprises a same material as any one of the plurality of inorganic insulating layers.

18. The display panel of claim 14, further comprising a second separator located at the third area between the second area and the partition wall,
wherein at least a portion of the organic encapsulation layer covers the second separator.

19. The display panel of claim 14, wherein the first separator comprises a fourth metal pattern layer over the third inorganic pattern layer,
wherein the fourth metal pattern layer comprises a first sublayer, a second sublayer, and a third sublayer that are sequentially stacked on one another, and
wherein the third sublayer comprises a tip protruding laterally from a point where a side surface of the second sublayer and a lower surface of the third sublayer meet each other.

20. The display panel of claim 19, wherein the first sublayer and the third sublayer comprise a same material as each other, and
wherein the second sublayer comprises a different material from that of the first sublayer and the third sublayer.

* * * * *